United States Patent
Kim

(10) Patent No.: US 11,742,009 B2
(45) Date of Patent: Aug. 29, 2023

(54) SEMICONDUCTOR DEVICE AND SEMICONDUCTOR SYSTEM RELATED TO WRITE LEVELING OPERATIONS

(71) Applicant: SK hynix Inc., Icheon-si (KR)

(72) Inventor: Hyun Seung Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 39 days.

(21) Appl. No.: 17/688,420

(22) Filed: Mar. 7, 2022

(65) Prior Publication Data
US 2023/0154508 A1 May 18, 2023

(30) Foreign Application Priority Data

Nov. 18, 2021 (KR) .......................... 10-2021-0159655

(51) Int. Cl.
*G11C 7/22* (2006.01)
(52) U.S. Cl.
CPC .............. *G11C 7/222* (2013.01); *G11C 7/225* (2013.01); *G11C 2207/2272* (2013.01)
(58) Field of Classification Search
CPC .. G11C 7/222; G11C 7/225; G11C 2207/2272
See application file for complete search history.

(56) References Cited

U.S. PATENT DOCUMENTS

| | | | | |
|---|---|---|---|---|
| 5,255,220 A * | 10/1993 | Filliman | .................. | G11C 8/16 365/240 |
| 10,839,876 B1 * | 11/2020 | Ito | ........................ | G11C 7/1072 |
| 11,031,064 B1 * | 6/2021 | Kim | .................. | G11C 11/40615 |
| 2021/0151087 A1 | 5/2021 | Ito et al. | | |
| 2022/0084569 A1 * | 3/2022 | Uemura | .................. | G11C 7/106 |

FOREIGN PATENT DOCUMENTS

KR 1020190044822 A 5/2019

* cited by examiner

*Primary Examiner* — Huan Hoang
*Assistant Examiner* — Minh Dinh
(74) *Attorney, Agent, or Firm* — WILLIAM PARK & ASSOCIATES LTD.

(57) ABSTRACT

A semiconductor device includes a pre-pulse generation circuit configured to generate a pre-pulse, based on a write shifting pulse and a write leveling activation signal; a write control signal generation circuit configured to generate a write control signal, based on the pre-pulse and a division clock; and a write leveling control circuit configured to generate detection data including information on a phase difference between a data clock and a system clock, based on the pre-pulse and the division clock.

26 Claims, 28 Drawing Sheets

SEMICONDUCTOR DEVICE AND SEMICONDUCTOR SYSTEM RELATED TO WRITE LEVELING OPERATIONS

CROSS-REFERENCE TO RELATED APPLICATIONS

The present application claims priority under 35 U.S.C. 119(a) to Korean Patent Application No. 10-2021-0159655, filed on Nov. 18, 2021, which is incorporated herein by reference in its entirety.

BACKGROUND

1. Technical Field

Embodiments of the present disclosure generally relate to semiconductor devices and semiconductor systems, and more particularly to semiconductor devices and semiconductor systems configured for performing a write leveling operation.

2. Related Art

In a semiconductor system used in a mobile device, a write leveling operation is performed to synchronize the phases of a system clock and a data clock applied from a controller to the semiconductor device. The write leveling operation may be performed in such a way that the phase of the data clock is adjusted based on the phase difference between the data clock and the system clock.

SUMMARY

According to an embodiment, there may be provided a semiconductor device comprising a pre-pulse generation circuit configured to generate a pre-pulse, based on a write/read shifting pulse and a write leveling activation signal; a write/read control signal generation circuit configured to generate a write/read control signal, based on the pre-pulse and a division clock; and a write leveling control circuit configured to generate detection data including information on a phase difference between a data clock and a system clock, based on the pre-pulse and the division clock.

In addition, according to another embodiment, there may be provided a semiconductor system including a controller configured to output an external control signal, a system clock, a data clock, and data and receive data and detection data; and a semiconductor device configured to receive the external control signal, the system clock, the data clock, and the data and apply the detection data to the controller. The semiconductor device is configured to generate a pre-pulse, based on a write shifting pulse, a read shifting pulse, and a write leveling activation signal, generate a write control signal for controlling input of the data, based on the pre-pulse, generates a read control signal for controlling output of the data, based on the pre-pulse, and generate the detection data including information on a phase difference between the data clock and the system clock, based on the pre-pulse.

In addition, according to another embodiment, there may be provided a semiconductor system including a controller that outputs a system clock and a data clock and receives detection data; and a semiconductor device configured to generate a pre-pulse, based on a write leveling activation signal and the system clock when entering a write leveling operation and generate detection data, based on the pre-pulse and a division clock to apply the detection data to the controller. The detection data may be set to have a first logic level when a phase of the data clock is faster than a phase of the system clock. The detection data may be set to have a second logic level when the phase of the data clock is slower than the phase of the system clock.

DETAILED DESCRIPTION

In the following description of embodiments, when a parameter is referred to as being "predetermined," it may be intended to mean that a value of the parameter is determined in advance when the parameter is used in a process or an algorithm. The value of the parameter may be set when the process or the algorithm starts or may be set during a section that the process or the algorithm is executed.

It will be understood that although the terms "first," "second," "third," etc. are used herein to describe various elements, these elements should not be limited by these terms. These terms are only used to distinguish one element from another element and are not intended to imply an order or number of elements. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage correspond to a signal having a logic "high" level, a signal having a second voltage correspond to a signal having a logic "low" level. In an embodiment, the logic "high" level may be set as a voltage level which is higher than a voltage level of the logic "low" level.

The term "logic bit set" may mean a combination of logic levels of bits included in a signal. When the logic level of each of the bits included in the signal is changed, the logic bit set of the signal may be set differently. For example, when the signal includes 2 bits, when the logic level of each of the 2 bits included in the signal is "logic low level, logic low level", the logic bit set of the signal may be set as the first logic bit set, and when the logic level of each of the two bits included in the signal is "a logic low level and a logic high level", the logic bit set of the signal may be set as the second logic bit set.

Various embodiments of the present disclosure will be described hereinafter in detail with reference to the accompanying drawings. However, the embodiments described herein are for illustrative purposes only and are not intended to limit the scope of the present disclosure.

Figure 1:
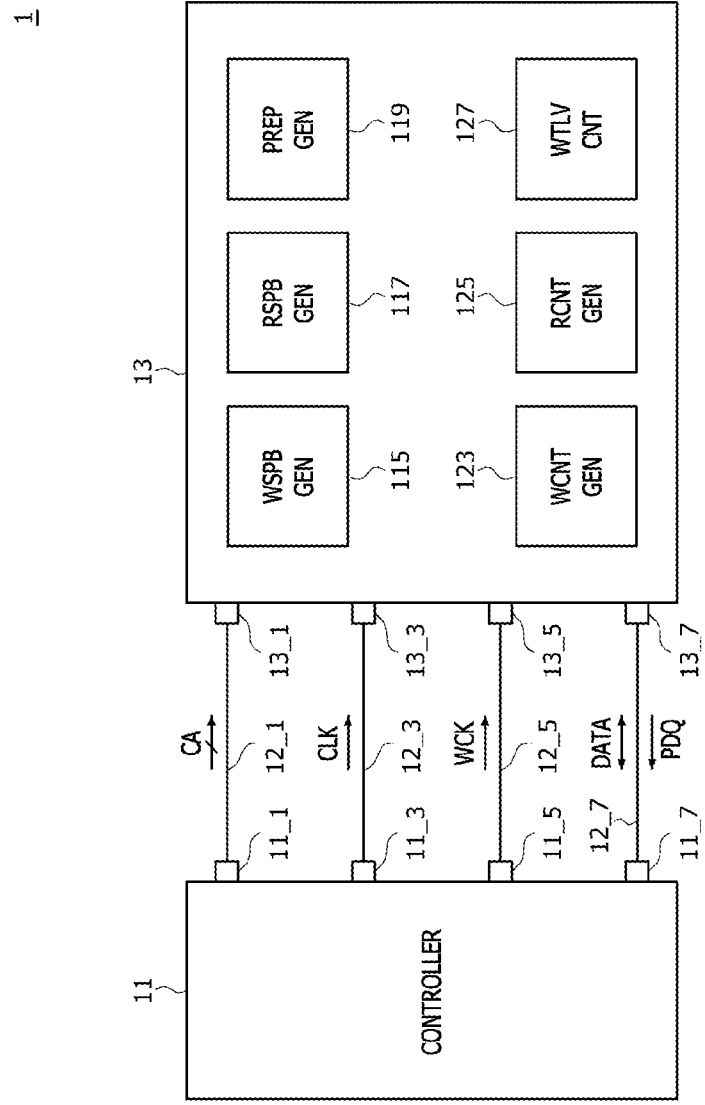
FIG. 1 is a block diagram illustrating a configuration of a semiconductor system according to an embodiment of the present disclosure.

FIG. 1 is a block diagram illustrating a configuration of a semiconductor system 1 according to an embodiment of the present disclosure. As shown in FIG. 1, the semiconductor system 1 may include a controller 11 and a semiconductor device 13.

The controller 11 may include a first control pin 11_1, a second control pin 11_3, a third control pin 11_5, and a fourth control pin 11_7. The semiconductor device 13 may include a first device pin 13_1, a second device pin 13_3, a third device pin 13_5, and a fourth device pin 13_7. The controller 11 may transmit an external control signal CA to the semiconductor device 13 through a first transmission line 12_1 connected between the first control pin 11_1 and the first device pin 13_1. In the present embodiment, the external control signal CA may include a command and an address, but this is only an example and the present disclosure is not limited thereto. Each of the first control pin 11_1, the first transmission line 12_1, and the first device pin 13_1 may be implemented in a plural number according to the number of bits of the external control signal CA. The controller 11 may transmit a system clock CLK to the semiconductor device 13 through a second transmission line 12_3 connected between the second control pin 11_3 and the second device pin 13_3. The controller 11 may transmit a data clock WCK to the semiconductor device 13 through a third transmission line 12_5 connected between the third control pin 11_5 and the third device pin 13_5. The controller 11 may apply data DATA to the semiconductor device 13 through a fourth transmission line 12_7 connected between the fourth control pin 11_7 and the fourth device pin 13_7. The controller 11 may receive data DATA or detection data PDQ through the fourth transmission line 12_7. Each of the fourth control pin 11_7, the fourth device pin 13_7, and the fourth transmission line 12_7 may be implemented in a plural number according to the number of bits of the data DATA or the detection data PDQ.

Figure 2:
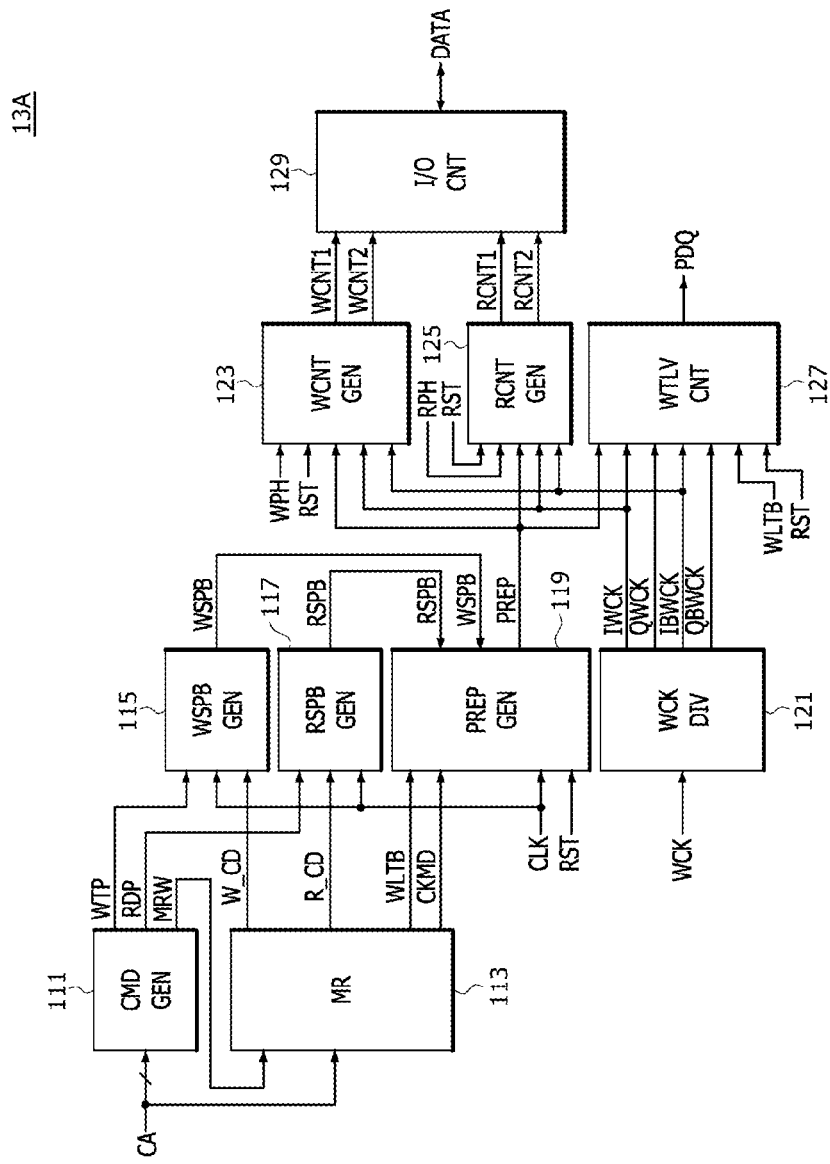
FIG. 2 is a block diagram illustrating a configuration of a semiconductor device according to an embodiment of the present disclosure.

The semiconductor device 13 may include a write shifting pulse generation circuit (WSPB GEN) 115 that shifts a write command (WTP of FIG. 2) by a write shifting section to generate a write shifting pulse (WSPB of FIG. 2). The semiconductor device 13 may include a read shifting pulse generation circuit (RSPB GEN) 117 that shifts a read command (RDP of FIG. 2) by a read shifting section to generate a read shifting pulse (RSPB of FIG. 2). The semiconductor device 13 may include a pre-pulse generation circuit (PREP GEN) 119 that generates a pre-pulse (PREP of FIG. 2) from the write shifting pulse (WSPB of FIG. 2) when a write operation is performed, generates a pre-pulse (PREP of FIG. 2) from the read shifting pulse (RSPB of FIG. 2) when a read operation is performed, and generates the pre-pulse (PREP of FIG. 2) from a write leveling activation signal (WLTB of FIG. 2) when a write leveling operation is performed. The semiconductor device 13 may include a write control signal generation circuit (WCNT GEN) 123 that generates write control signals (WCNT1 and WCNT2 of FIG. 2) from the pre-pulse (PREP of FIG. 2) when a write operation is performed. The semiconductor device 13 may include a read control signal generation circuit (RCNT GEN) 125 that generates read control signals (RCNT1 and RCNT2 of FIG. 2) from the pre-pulse (PREP of FIG. 2) when a read operation is performed. The semiconductor device 13 may include a write leveling control circuit (WTLV CNT) 127 that generates detection data PDQ from the pre-pulse (PREP of FIG. 2) when a write leveling operation is performed.

FIG. 2 is a block diagram illustrating a configuration of a semiconductor device 13A according to an embodiment of the present disclosure. As shown in FIG. 2, the semiconductor device 13A may include a command generation circuit (CMD GEN) 111, a mode register (MR) 113, a write shifting pulse generation circuit (WSPB GEN) 115, a read shifting pulse generation circuit (RSPB GEN) 117, a pre-pulse generation circuit (PREP GEN) 119, a data clock division circuit (WCK DIV) 121, a write control signal generation circuit (WCNT GEN) 123, a read control signal generation circuit (RCNT GEN) 125, a write leveling control circuit (WTLV GEN) 127, and an input/output control circuit (I/O CNT) 129.

The command generation circuit 111 may generate a write command WTP, a read command RDP, and a mode register write command MRW, based on an external control signal CA. The command generation circuit 111 may decode the external control signal CA to generate a write command WTP for a write operation. The command generation circuit 111 may decode the external control signal CA to generate a read command RDP for a read operation. The command generation circuit 111 may decode the external control signal CA to generate a mode register write command MRW for a mode register write operation. Each of the logic bit sets of bits included in the external control signal CA received when each of the write command WTP, the read command RDP, and the mode register write command MRW is generated in the command generation circuit 111 may be set differently. The command generation circuit 111 may be connected to the mode register 113, the write shifting pulse generation circuit 115, and the read shifting pulse generation circuit 117. The command generation circuit 111 may apply the write command WTP to the write shifting pulse generation circuit 115 when a write operation is performed. The command generation circuit 111 may apply the read command RDP to the read shifting pulse generation circuit 117 when a read operation is performed. The command generation circuit 111 may apply the mode register write command MRW to the mode register 113 when a mode register write operation is performed.

The mode register 113 may be connected to the command generation circuit 111, the write shifting pulse generation circuit 115, the read shifting pulse generation circuit 117, and the pre-pulse generation circuit 119. The mode register 113 may receive the mode register write command MRW from the command generation circuit 111 when a mode register write operation is performed. The mode register 113 may generate a write code W_CD, a read code R_CD, a write leveling activation signal WLTB, and a clock mode signal CKMD from the external control signal CA, based on the mode register write command MRW. The write code W_CD may include bits each having a logic bit set for setting a write shifting section for shifting the write command WTP to generate a write shifting pulse WSPB in a write operation. The read code R_CD may include bits each having a logic bit set for setting a read shifting section for shifting the read command RDP to generate a read shifting pulse RSPB in a read operation. The write leveling activation signal WLTB may be activated for a write leveling operation. The clock mode signal CKMD may have a logic level set according to a frequency ratio of a system clock CLK and a data clock WCK. As an example, the clock mode signal CKMD may be set to have a logic "high" level in a first clock mode in which the frequency ratio of the system clock CLK and the data clock WCK is set to 1:2, and may be set to have a logic "low" level in a second clock mode in which the frequency ratio of the system clock CLK and the data clock WCK is set to 1:4. The write leveling operation may be performed in a state where the frequency ratio of the system clock CLK and the data clock WCK is set to 1:2 regardless of the clock mode signal CKMD. The mode register 113 may apply the write code W_CD to the write shifting pulse generation circuit 115. The mode register 113 may apply the read code R_CD to the read shifting pulse generation circuit 117. The mode register 113 may apply the write leveling activation signal WLTB and the clock mode signal CKMD to the pre-pulse generation circuit 119.

The write shifting pulse generation circuit 115 may be connected to the command generation circuit 111, the mode register 113, and the pre-pulse generation circuit 119. The write shifting pulse generation circuit 115 may receive the write command WTP from the command generation circuit 111 and receive the write code W_CD from the mode register 113. The write shifting pulse generation circuit 115 may shift the write command WTP, based on the write code W_CD and the system clock CLK to generate a write shifting pulse WSPB. The write shifting pulse generation circuit 115 may generate the write shifting pulse WSPB that is activated at a time point when a write shifting section set according to the write code W_CD elapses from a time point when the write command WTP is generated. The write shifting pulse generation circuit 115 may apply the write shifting pulse WSPB to the pre-pulse generation circuit 119.

The read shifting pulse generation circuit 117 may be connected to the command generation circuit 111, the mode register 113, and the pre-pulse generation circuit 119. The read shifting pulse generation circuit 117 may receive the read command RDP from the command generation circuit 111 and receive the read code R_CD from the mode register 113. The read shifting pulse generation circuit 117 may shift the read command RDP, based on the read code R_CD and the system clock CLK to generate the read shifting pulse RSPB. The read shifting pulse generation circuit 117 may generate the read shifting pulse RSPB that is activated at a time point when the read shifting section set according to the read code R_CD elapses from a time point when the read command RTP is generated. The read shifting pulse generation circuit 117 may apply the read shifting pulse RSPB to the pre-pulse generation circuit 119.

The pre-pulse generation circuit 119 may be connected to the mode register 113, the write shifting pulse generation circuit 115, and the read shifting pulse generation circuit 117. The pre-pulse generation circuit 119 may receive the write leveling activation signal WLTB and the clock mode signal CKMD from the mode register 113, receive the write shifting pulse WSPB from the write shifting pulse generation circuit 115, and receive the read shifting pulse RSPB from the read shifting pulse generation circuit 117. The pre-pulse generation circuit 119 may generate a pre-pulse PREP, based on the write leveling activation signal WLTB, the clock mode signal CKMD, the write shifting pulse WSPB, the read shifting pulse RSPB, the system clock CLK, and a reset signal RST. The pre-pulse generation circuit 119 may initialize the pre-pulse PREP when the reset signal RST is activated for an initialization operation. The pre-pulse generation circuit 119 may generate the pre-pulse PREP from the write shifting pulse WSPB when a write operation is performed. A pulse width of the pre-pulse PREP generated in the pre-pulse generation circuit 119 may be set to be twice larger when a write operation is performed in a first clock mode than when the write operation is performed in a second clock mode. The pre-pulse generation circuit 119 may generate the pre-pulse PREP from the read shifting pulse RSPB when a read operation is performed. A pulse width of the pre-pulse PREP generated in the pre-pulse generation circuit 119 may be set to be twice larger when the read operation is performed in the first clock mode than when the read operation is performed in the second clock mode. The pre-pulse generating circuit 119 may generate the pre-pulse PREP from the write leveling activation signal WLTB when a write leveling operation is performed.

The data clock division circuit 121 may divide the data clock WCK to generate a first division clock IWCK, a second division clock QWCK, a first inverted division clock IBWCK, and a second inverted division clock QBWCK. The cycle of each of the first division clock IWCK, the second division clock QWCK, the first inverted division clock IBWCK, and the second inverted division clock QBWCK may be set to be twice as large as the cycle of the data clock WCK. The phase of the second division clock QWCK may be set to be later than the phase of the first division clock IWCK by 90 degrees, the phase of the first inverted division clock IBWCK may be set to be later than the phase of the first division clock IWCK by 180 degrees, and the phase of the second inverted division clock QBWCK may be set to be later than the phase of the first division clock IWCK by 270 degrees. The data clock division circuit 121 may be connected to the write control signal generation circuit 123, the read control signal generation circuit 125, and the write leveling control signal 127. The data clock division circuit 121 may apply the first division clock IWCK and the first inverted division clock IBWCK to the write control signal generation circuit 123 and the read control signal generation circuit. The data clock division circuit 121 may apply the first division clock IWCK, the second division clock QWCK, the first inverted division clock IBWCK, and the second inverted division clock QBWCK to the write leveling control circuit 127.

The write control signal generation circuit 123 may be connected to the pre-pulse generation circuit 119, the data clock division circuit 121, and the input/output control circuit 129. The write control signal generation circuit 123 may receive the pre-pulse PREP from the pre-pulse generation circuit 119 and receive the first division clock IWCK and the first inverted division clock IBWCK from the data clock division circuit 121. The write control signal generation circuit 123 may generate a first write control signal WCNT1 and a second write control signal WCNT2, based on a write phase signal WPH, the reset signal RST, the first division clock IWCK, and the first inverted division clock IBWCK. The write phase signal WPH may be set to have a first logic level when the pre-pulse PREP is generated in synchronization with a rising edge of the first division clock IWCK (hereinafter, referred to as "positive-phase state") and may be set to have a second logic level when the pre-pulse PREP is generated in synchronization with a rising edge of the first inverted division clock IBWCK (hereinafter, referred to as "negative-phase state"). The write control signal generation circuit 123 may generate the first write control signal WCNT1 from the pre-pulse PREP when the write phase signal WPH is set to have the first logic level. The write control signal generation circuit 123 may generate the second write control signal WCNT2 from the pre-pulse PREP when the write phase signal WPH is set to have the second logic level. The write control signal generation circuit 123 may apply the first write control signal WCNT1 and the second write control signal WCNT2 to the input/output control circuit 129.

The read control signal generation circuit 125 may be connected to the pre-pulse generation circuit 119, the data clock division circuit 121, and the input/output control circuit 129. The read control signal generation circuit 125 may receive the pre-pulse PREP from the pre-pulse generation circuit 119 and receive the first division clock IWCK and the first inverted division clock IBWCK from the data clock division circuit 121. The read control signal generation circuit 125 may generate a first read control signal RCNT1 and a second read control signal RCNT2, based on a read phase signal RPH, the reset signal RST, the first division clock IWCK, and the first inverted division clock IBWCK. The read phase signal RPH may be set to have a first logic level when the pre-pulse PREP is generated in synchronization with the rising edge of the first division clock IWCK (hereinafter, referred to as "positive-phase state") and may be set to have a second logic level when the pre-pulse PREP is generated in synchronization with the rising edge of the first inverted division clock IBWCK (hereinafter, referred to as "negative-phase state"). The read control signal generation circuit 125 may generate the first read control signal RCNT1 from the pre-pulse PREP when the read phase signal RPH is set to have the first logic level. The read control signal generation circuit 125 may generate the second read control signal RCNT2 from the pre-pulse PREP when the read phase signal RPH is set to have the second logic level. The read control signal generation circuit 125 may apply the first read control signal RCNT1 and the second read control signal RCNT2 to the input/output control circuit 129.

The write leveling control circuit 127 may be connected to the mode register 113, the pre-pulse generation circuit 119, and the data clock division circuit 121. The write leveling control circuit 127 may receive the write leveling activation signal WLTB from the mode register 113. The write leveling control circuit 127 may receive the pre-pulse PREP from the pre-pulse generation circuit 119 and receive the first division clock IWCK, the second division clock QWCK, the first inverted division clock IBWCK, and the second inverted division clock QBWCK from the data division circuit 121. The write leveling control circuit 127 may initialize detection data PDQ, based on the reset signal RST. The write leveling control circuit 127 may generate the detection data PDQ from the pre-pulse PREP, based on the write leveling activation signal WLTB, the first division clock IWCK, the second division clock QWCK, the first inverted division clock IBWCK, and the second inverted division clock QBWCK. The detection data PDQ may include information on a phase difference between the system clock CLK and the data clock WCK. As an example, when the system clock CLK has a faster phase than the data clock WCK, the detection data PDQ may be generated at a logic "high" level at the end of the write leveling section (tWCKTGGL in FIG. 26).

The input/output control circuit 129 may be connected to the write control signal generation circuit 123 and the read control signal generation circuit 125. The input/output control circuit 129 may receive the first write control signal WCNT1 and the second write control signal WCNT2 from the write control signal generation circuit 123 and receive the first read control signal RCNT1 and the second read control signal RCNT2 from the read control signal generation circuit 125. The input/output control circuit 129 may control an input operation of data DATA, based on the first write control signal WCNT1 when a write operation is performed in a positive-phase state and control the input operation of the data DATA, based on the second write control signal WCNT2 when a write operation is performed in a negative-phase state. The input/output control circuit 129 may control an output operation of data DATA, based on the first read control signal RCNT1 when a read operation is performed in the positive-phase state and control the output operation of data DATA, based on the second read control signal RCNT2 when a read operation is performed in the negative-phase state.

Figure 3:
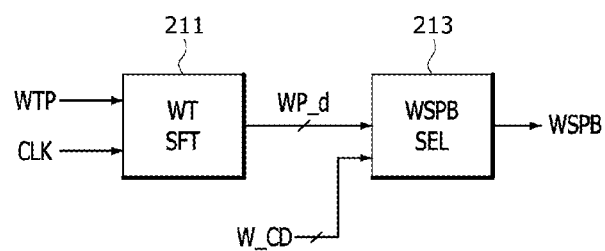
FIG. 3 is a block diagram illustrating a configuration of a write shifting pulse generation circuit according to an embodiment of the present disclosure.

FIG. 3 is a block diagram illustrating a configuration of a write shifting pulse generation circuit 115A according to an embodiment of the present disclosure. As shown in FIG. 3, the write shifting pulse generation circuit 115A may include a write shifting circuit 211 and a write shifting pulse selection circuit 213.

The write shifting circuit 211 may delay a write command WTP to generate a delayed write pulse WP_d, based on a system clock CLK. As an example, the write shifting circuit 211 may delay the write command WTP by one cycle of the system clock CLK to generate a first bit WP_d<1> of the delayed write pulse WP_d and delay the write command WTP by 3 cycles of the system clock CLK to generate a $J^{th}$ bit WP_d<J> of the delayed write pulse WP_d. Here, 'J' may be set to a natural number of 2 or more.

The write shifting pulse selection circuit 213 may be connected to the write shifting circuit 211. The write shifting pulse selection circuit 213 may receive the delayed write pulse WP_d from the write shifting circuit 211 and receive a write code W_CD from a mode register (113 of FIG. 2). The write shifting pulse selection circuit 213 may generate a write shifting pulse WSPB from the delayed write pulse WP_d, based on the write code W_CD. The write shifting pulse selection circuit 213 may select a bit generated with a delay by the write shifting section set by the write code W_CD from among the bits included in the delayed write pulse WP_d to output the selected bit as a write shifting pulse WSPB.

Figure 4:
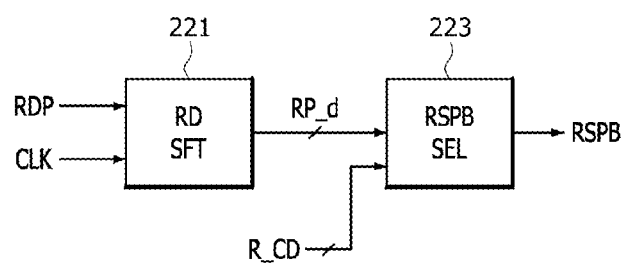
FIG. 4 is a block diagram illustrating a configuration of a read shifting pulse generation circuit according to an embodiment of the present disclosure.

FIG. 4 is a block diagram illustrating a configuration of a read shifting pulse generation circuit 117A according to an embodiment of the present disclosure. As shown in FIG. 4, the read shifting pulse generation circuit 117A may include a read shifting circuit 221 and a read shifting pulse selection circuit 223.

The read shifting circuit 221 may delay a read command RDP, based on a system clock CLK to generate a delayed read pulse RP_d. As an example, the read shifting circuit 221 may delay the read command RDP by one cycle of the system clock CLK to generate a first bit RP_d<1> of the delayed read pulse RP_d and delay the read command RDP by the K cycles of the system clock CLK to generate a $K^{th}$ bit RP_d<K> of the delayed read pulse RP_d. Here, 'K' may be set to a natural number of 2 or more.

The read shifting pulse selection circuit 223 may be connected to the read shifting circuit 221. The read shifting pulse selection circuit 223 may receive the delayed read pulse RP_d from the read shifting circuit 221 and receive a read code R_CD from a mode register (113 of FIG. 2). The read shifting pulse selection circuit 223 may generate a read shifting pulse RSPB from the delayed read pulse RP_d, based on the read code R_CD. The read shifting pulse selection circuit 223 may select a bit generated with delay by a read shifting section set by the read code R_CD from among the bits included in the delayed read pulse RP_d to output the selected bit as the read shifting pulse RSPB.

Figure 5:
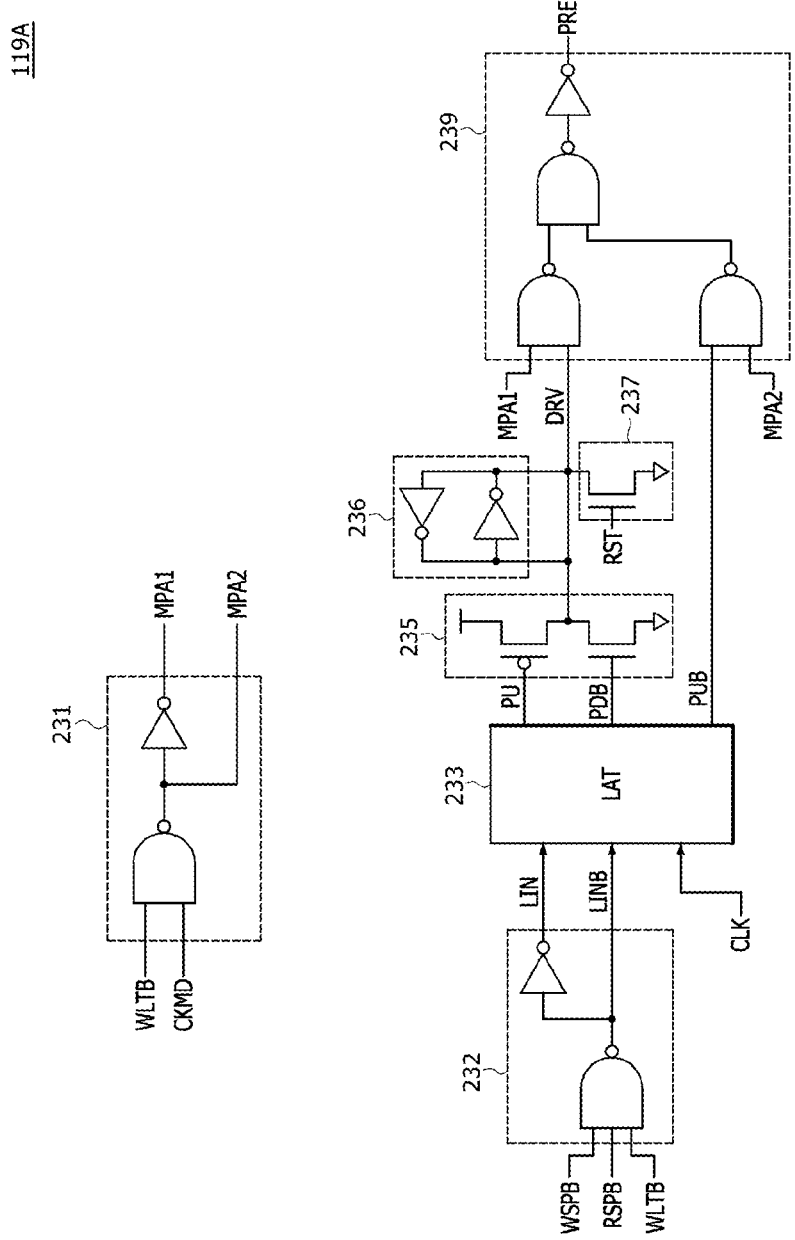
FIG. 5 is a diagram illustrating a configuration of a pre-pulse generation circuit according to an embodiment of the present disclosure.

FIG. 5 is a diagram illustrating a configuration of a pre-pulse generation circuit 119A according to an embodiment of the present disclosure. As shown in FIG. 5, the pre-pulse generation circuit 119A may include a mode path signal generation circuit 231, a latch input signal generation circuit 232, a latch circuit 233, a drive signal generation circuit 235, a drive signal latch 236, a reset circuit 237, and a pre-pulse output circuit 239.

The mode path signal generation circuit 231 may generate a first mode path signal MPA1 and a second mode path signal MPA2, based on a write leveling activation signal WLTB and a clock mode signal CKMD. The mode path signal generation circuit 231 may generate the first mode path signal MPA1 that is activated according to the clock mode signal CKMD in a first clock mode. In the first clock mode, the frequency ratio of a system clock CLK and a data clock WCK may be set to 1:2. The mode path signal generation circuit 231 may generate the second mode path signal MPA2 that is activated according to the clock mode signal CKMD in a second clock mode. In the second clock mode, the frequency ratio of the system clock CLK and the data clock WCK may be set to 1:4. The mode path signal generation circuit 231 may generate the second mode path signal MPA2 that is activated when a write leveling operation is performed and the write leveling activation signal WLTB is activated.

The latch input signal generation circuit 232 may generate a latch input signal LIN and an inverted latch input signal LINB, based on a write shifting pulse WSPB, a read shifting pulse RSPB, and the write leveling activation signal WLTB. The latch input signal generation circuit 232 may generate the latch input signal LIN that is set to have a first logic level and the inverted latch input signal LINB that is set to have a second logic level when one of the write shifting pulse WSPB, the read shifting pulse RSPB, and the write leveling activation signal WLTB is activated. As an example, the latch input signal generation circuit 232 may generate a latch input signal that is set to have a logic "low" level and an inverted latch input signal LINB that is set to have a logic "high" level when a write operation is performed and a write shifting pulse WSPB is activated. As another example, the latch input signal generation circuit 232 may generate a latch input signal LIN that is set to have a logic "low" level and an inverted latch input signal LINB that is set to have a logic "high" level when a read operation is performed and a read shifting pulse RSPB is activated. As another example, the latch input signal generation circuit 232 may generate a latch input signal LIN that is set to have a logic "low" level and an inverted latch input signal LINB that is set to have a logic "high" level when a write leveling operation is performed and a write leveling activation signal WLTB is activated. In the present embodiment, the first logic level is set to a logic "low" level and the second logic level is set to a logic "high" level as an example, but the embodiments are not limited thereto. The latch input signal generation circuit 232 may be connected to the latch circuit 233 to apply the latch input signal LIN and the inverted latch input signal LINB to the latch circuit 233.

The latch circuit 233 may be connected to the latch input signal generation circuit 232 to receive the latch input signal LIN and the inverted latch input signal LINB. The latch circuit 233 may generate a pull-up signal PU, an inverted pull-up signal PUB, a pull-down signal PD, and an inverted pull-down signal PDB, based on a system clock CLK, the latch input signal LIN, and the inverted latch input signal LINB. The latch circuit 233 may generate the pull-up signal PU and the inverted pull-up signal PUB, based on the system clock CLK and the inverted latch input signal LINB. As an example, the latch circuit 233 may generate a pull-up signal PU that is activated to a logic "low" level and an inverted pull-up signal PUB that is activated to a logic "high" level when both the system clock CLK and the inverted latch input signal LINB are at a logic "high" level. The latch circuit 233 may generate the pull-down signal PD and the inverted pull-down signal PDB, based on the system clock CLK and the latch input signal LIN. As an example, the latch circuit 233 may generate an inverted pull-down signal PDB that is activated to a logic "high" level when both the system clock CLK and the latch input signal LIN are at a logic "high" level.

The drive signal generation circuit 235 may be connected to the latch circuit 233 to receive the pull-up signal PU and the inverted pull-down signal PDB. The drive signal generation circuit 235 may drive a drive signal DRV, based on the pull-up signal PU and the inverted pull-down signal PDB. The drive signal generation circuit 235 may pull-up drive the drive signal DRV, based on the pull-up signal PU and may pull-down drive the drive signal DRV, based on the inverted pull-down signal PDB. As an example, the drive signal generation circuit 235 may pull-up drive the drive signal DRV to a logic "high" level when the pull-up signal PU is activated to a logic "low" level, and may pull-down drive the drive signal DRV to a logic "low" level when the inverted pull-down signal PDB is activated to a logic "high" level. The drive signal latch 236 may latch the drive signal DRV. The reset circuit 237 may initialize the drive signal DRV, based on the reset signal RST that is activated during the initialization operation. As an example, the reset circuit 237 may initialize the drive signal DRV to a logic "low" level when the reset signal RST is activated to a logic "high" level.

The pre-pulse output circuit 239 may be connected to the mode path signal generation circuit 231, the latch circuit 233, and the drive signal generation circuit 235. The pre-pulse output circuit 239 may receive the first mode path signal MPA1 and the second mode path signal MPA2 from the mode path signal generation circuit 231. The pre-pulse output circuit 239 may receive the inverted pull-up signal PUB from the latch circuit 233 and receive the drive signal DRV from the drive signal generation circuit 235. The pre-pulse output circuit 239 may generate a pre-pulse PREP, based on the first mode path signal MPA1, the second mode path signal MPA2, the drive signal DRV, and the inverted pull-up signal PUB. The pre-pulse output circuit 239 may generate the pre-pulse PREP from the drive signal DRV when a write operation or a read operation is performed in a first clock mode. The pre-pulse output circuit 239 may generate the pre-pulse PREP from the inverted pull-up signal PUB when a write operation or a read operation is performed in a second clock mode. The pre-pulse output circuit 239 may generate the pre-pulse PREP from the inverted pull-up signal PUB when a write leveling operation is performed. The pre-pulse output circuit 239 may generate a pre-pulse PREP having a longer pulse width when a write operation or a read operation is performed in the first clock mode than when a write operation or a read operation is performed in the second clock mode or a write leveling operation is performed.

Figure 6:
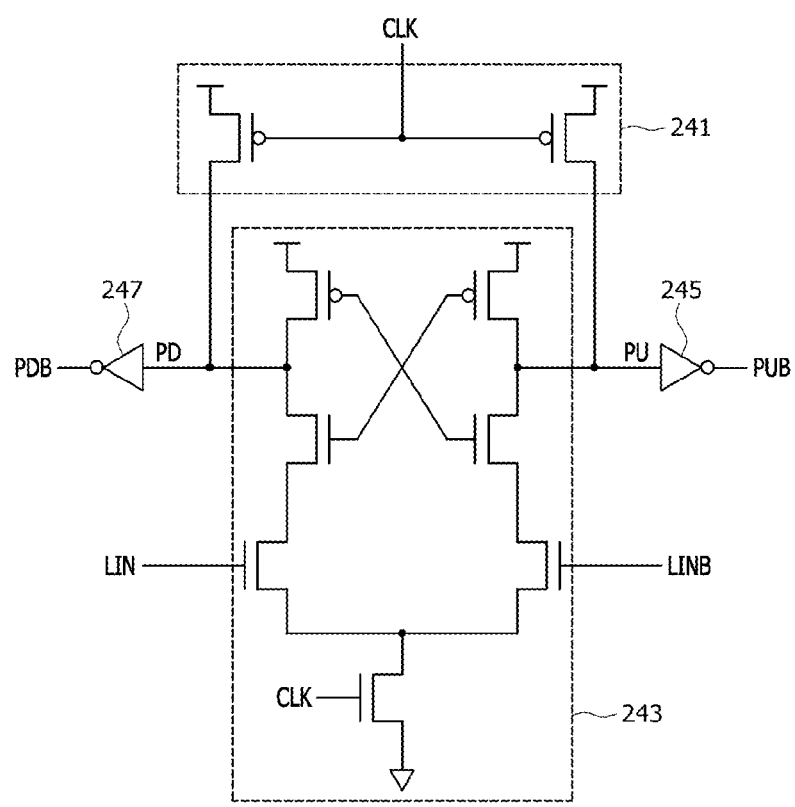
FIG. 6 is a circuit diagram according to an example of a latch circuit according to an embodiment of the present disclosure.

FIG. 6 is a circuit diagram of a latch circuit 233A according to an embodiment of the present disclosure. As shown in FIG. 6, the latch circuit 233A may include a clock driver 241, a differential driver 243, a pull-up inversion buffer 245, and a pull-down inversion buffer 247. The clock driver 241 may drive both a pull-up signal PU and a pull-down signal PD to a logic "high" level when a system clock CLK is at a logic "low" level. The differential driver 243 may differentially amplify a latch input signal LIN and an inverted latch input signal LINB to drive the pull-up signal PU and the pull-down signal PD when the system clock CLK is at a logic "high" level. The differential driver 243 may generate a pull-up signal PU that is activated to a logic "low" level when both the system clock CLK and the inverted latch input signal LINB are at a logic "high" level. The pull-up inversion buffer 245 may inversely buffer the pull-up signal PU to generate the inverted pull-up signal PUB. The differential driver 243 and the pull-down inversion buffer 247 may generate the inverted pull-down signal PDB that is activated to a logic "high" level when both the system clock CLK and the latch input signal LIN are at a logic "high" level.

FIGS. 7 to 11 are timing diagrams illustrating an operation of a pre-pulse generation circuit 119A according to an embodiment of the present disclosure. An operation of the pre-pulse generation circuit 119A when a write operation is performed in a first clock mode, an operation of the pre-pulse generation circuit 119A when a write operation is performed in a second clock mode, an operation of the pre-pulse generation circuit 119A when a read operation is performed in a first clock mode, an operation of the pre-pulse generation circuit 119A when a read operation is performed in the second clock mode, and an operation of the pre-pulse generation circuit 119A when a write leveling operation is performed will be described separately as follows with reference to FIGS. 7 to 11.

Figure 7:
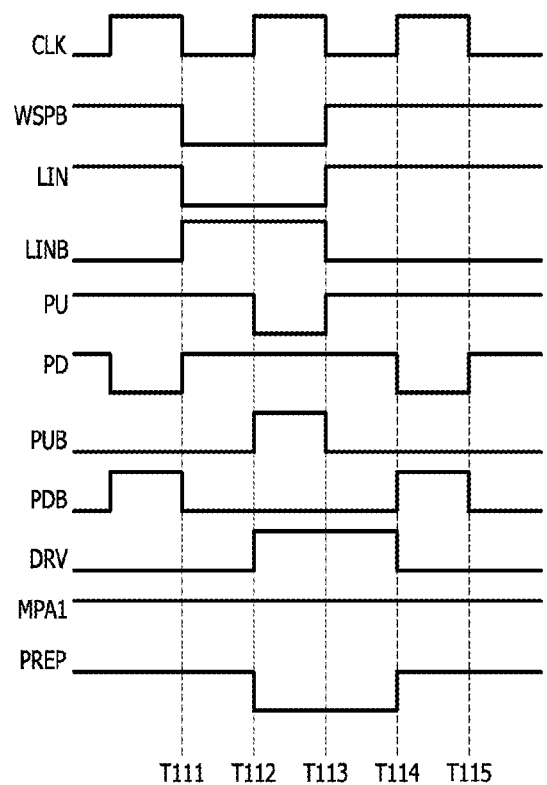
FIGS. 7 to 11 are timing diagrams illustrating an operation of a pre-pulse generation circuit according to an embodiment of the present disclosure.

As shown in FIG. 7, when a write operation is performed in the first clock mode, a latch input signal LIN is generated at a logic "low" level and an inverted latch input signal LINB is generated at a logic "high" level during a section T111~T113 in which a write shifting pulse WSPB is activated to a logic "low" level. As used herein, the tilde "~" indicates a range of components. For example, "T111~T113" indicates the sections T111, T112, and T113 shown in FIG. 7. A pull-up signal PU is activated to a logic "low" level during a section T112~T113 in which both a system clock CLK and an inverted latch input signal LINB are at a logic "high" level. An inverted pull-down signal PDB is activated to a logic "high" level during a section T114~T115 in which both the system clock CLK and the latch input signal LIN are at a logic "high" level. The drive signal DRV is generated at a logic "high" level during a section from a time point T112 when the pull-up signal PU is activated to a logic "low" level to a time point T114 when the inverted pull-down signal PDB is activated to a logic "high" level. Since a first mode path signal MPA1 is set to have a logic "high" level in the first clock mode, a pre-pulse PREP is generated at a logic "low" level by inversely buffering the drive signal DRV during a section T112~T114.

Figure 8:
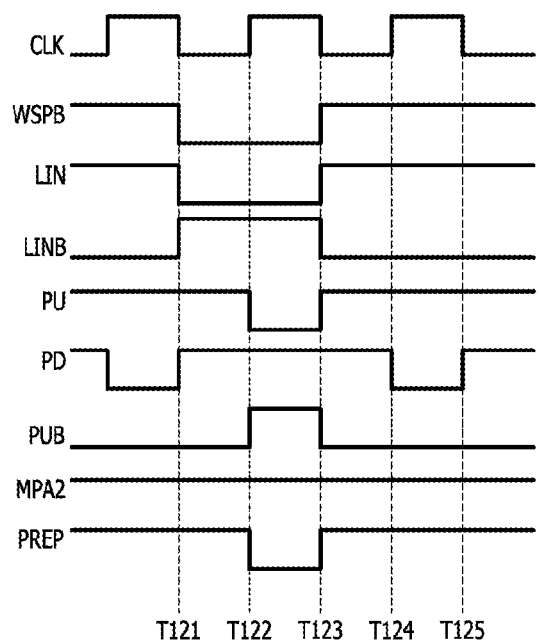

As shown in FIG. 8, when a write operation is performed in a second clock mode, the latch input signal LIN is generated at a logic "low" level and the inverted latch input signal LINB is generated at a logic "high" level during a section T121~T123 in which the write shifting pulse WSPB is activated at a logic "low" level. The pull-up signal PU is activated to a logic "low" level during a section T122~T123 in which both the system clock CLK and the inverted latch input signal LINB are at a logic "high" level. The inverted pull-up signal PUB is activated to a logic "high" level during a section T122~T123 in which both the system clock CLK and the inverted latch input signal LINB are at logic "high" level. Since a second mode path signal MPA2 is set to have a logic "high" level in the second clock mode the pre-pulse PREP is generated at a logic "low" level by inversely buffering the inversely buffering the inverted pull-up signal PUB during the section T122~T123. Referring to FIGS. 7 and 8, it can be seen that the pulse width of the pre-pulse PREP generated in the pre-pulse generation circuit 119A when a write operation is performed in the first clock mode is set to be twice as large as the pulse width of the pre-pulse PREP generated in the pre-pulse generation circuit 119A when the write operation is performed in the second clock mode.

Figure 9:
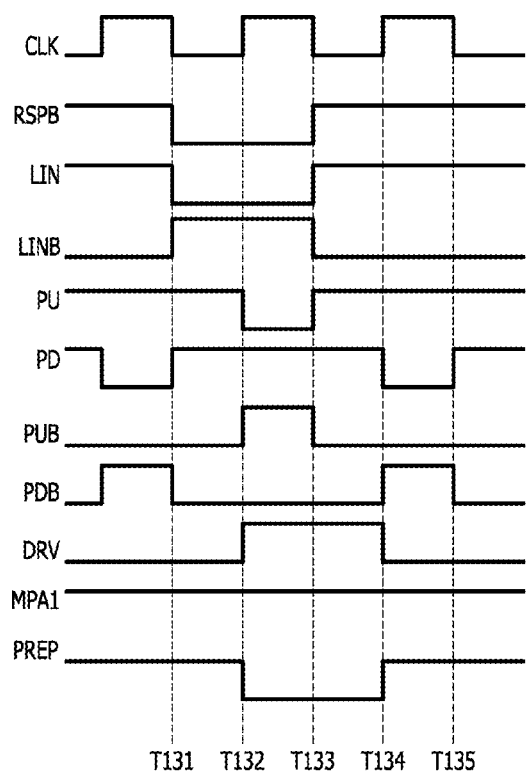

As shown in FIG. 9, when a read operation is performed in the first clock mode, the latch input signal LIN is generated at a logic "low" level and the inverted latch input signal LINB is generated at a logic "high" level during a section T131~T133 in which the read shifting pulse RSPB is activated to a logic "low" level. The pull-up signal PU is activated to a logic "low" level during a section T132~T133 in which both the system clock CLK and the inverted latch input signal LINB are at a logic "high" level. The inverted pull-down signal PDB is activated to a logic "high" level during a section T134~T135 in which both the system clock CLK and the latch input signal LIN are at a logic "high" level. The drive signal DRV may be generated at a logic "high" level during a section from a time point T132 when the pull-up signal PU is activated to a logic "low" level to a time point T134 when the inverted pull-down signal PDB is activated to a logic "high" level. Since the first mode path signal MPA1 is set to have a logic "high" level in the first clock mode, the pre-pulse PREP is generated at a logic "low" level by inversely buffering the drive signal DRV.

Figure 10:
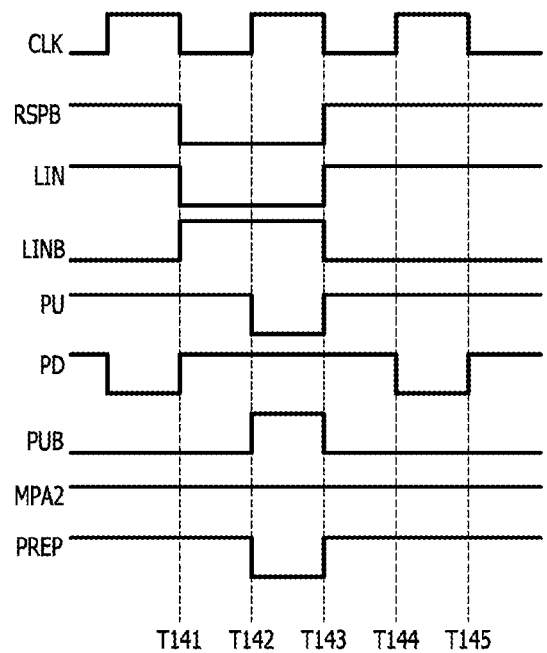

As shown in FIG. 10, when a read operation is performed in the second clock mode, the latch input signal LIN is generated at a logic "low" level and the inverted latch input signal LINB is generated at a logic "high" level during a section T141~T143 in which the read shifting pulse RSPB is activated to a logic "low" level. The pull-up signal PU is activated to a logic "low" level during a section T142~T143 in which both the system clock CLK and the inverted latch input signal LINB are at a logic "high" level. The inverted pull-up signal PUB is activated to a logic "high" level during the section T142~T143 in which both the system clock CLK and the inverted latch input signal LINB are at a logic "high" level. Since the second mode path signal MPA2 is set to have a logic "high" level in the second clock mode, the pre-pulse PREP is generated at a logic "low" level by inversely buffering the inverted pull-up signal PUB during the section T142~T143. Referring to FIGS. 9 and 10, it can be seen that the pulse width of the pre-pulse PREP generated in the pre-pulse generation circuit 119A when a write operation is performed in the first clock mode is set to be twice as large as the pulse width of the pre-pulse PREP generated in the pre-pulse generation circuit 119A when the write operation is performed in the second clock mode.

Figure 11:
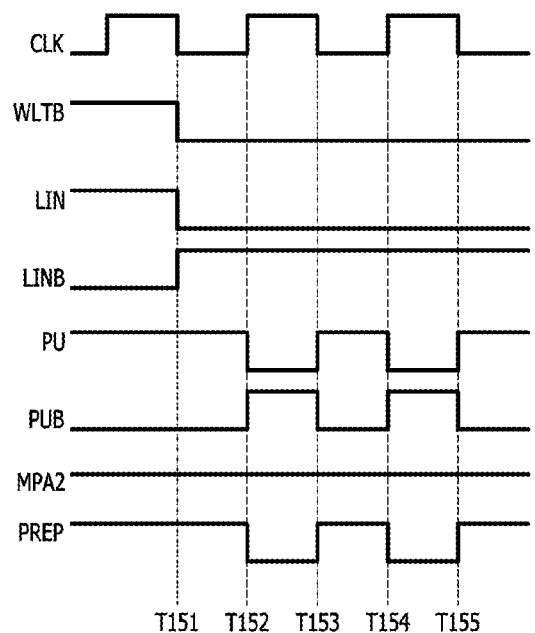

As shown in FIG. 11, when a write leveling operation is performed, during a section after a time point T151 when the write leveling activation signal WLTB is activated to a logic "low" level, the latch input signal LIN is generated at a logic "low" level and the inverted latch input signal LINB is generated at a logic "high" level. The pull-up signal PU is activated to a logic "low" level during sections T152~T153 and T154~T155 in which both the system clock CLK and the inverted latch input signal LINB are at logic "high" level. The inverted pull-up signal PUB is activated to a logic "high" level during sections T152~T153 and T154~T155 in which both the system clock CLK and the inverted latch input signal LINB are at logic "high" level. Since the second mode path signal MPA2 is set to a logic "high" level when the write leveling operation is performed, the pre-pulse PREP is generated at a logic "low" level by inversely buffering the inverted pull-up signal PUB during the sections T152~T153 and T154~T155.

As described above, the pre-pulse generation circuit 119A generates the pre-pulse PREP through the same path in all of the write operation, the read operation, and the write leveling operation, a mismatch between a normal operation including a write operation and a read operation and a write leveling operation can be minimized.

Figure 12:
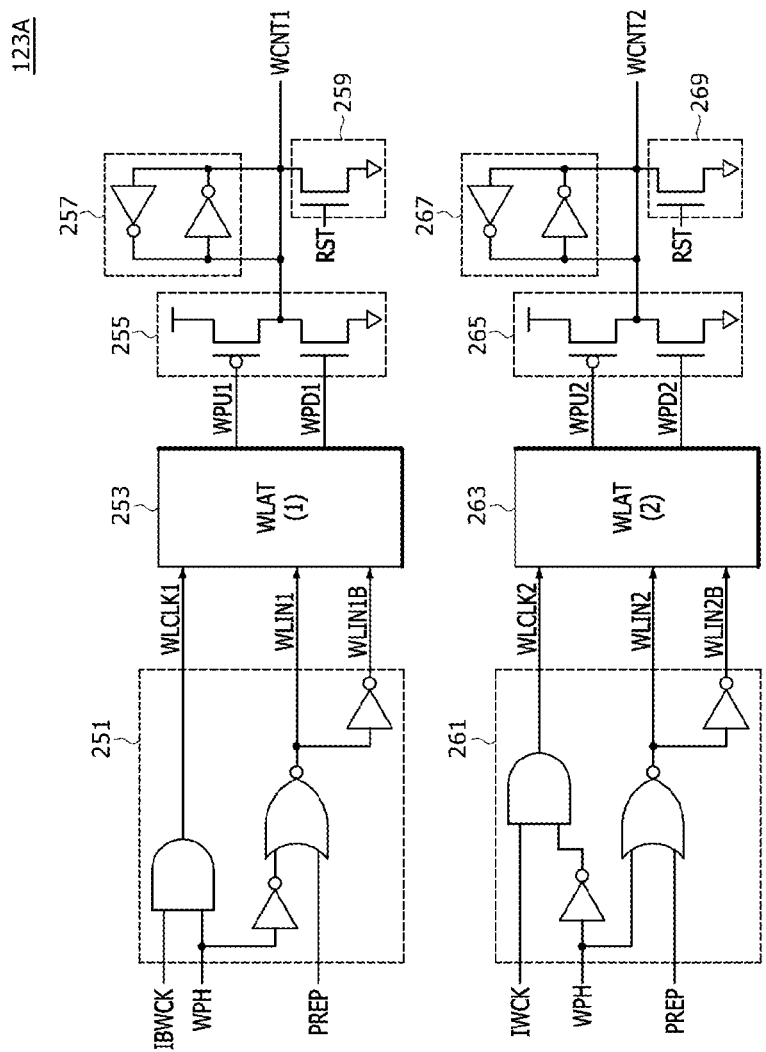
FIG. 12 is a diagram illustrating a configuration of a write control signal generation circuit according to an embodiment of the present disclosure.

FIG. 12 is a diagram illustrating a configuration of a write control signal generation circuit 123A according to an embodiment of the present disclosure. As shown in FIG. 12, the write control signal generation circuit 123A may include a first write latch input signal generation circuit 251, a first write latch circuit 253, a first write drive circuit 255, a first write control signal latch 257, a first write reset circuit 259, a second write latch input signal generation circuit 261, a second write latch circuit 263, a second write drive circuit 265, a second write control signal latch 267, and a second write reset circuit 269.

The first write latch input signal generation circuit 251 may generate a first write latch clock WLCLK1, a first write latch input signal WLIN1, and a first inverted write latch input signal WLIN1B from a first inverted division clock IBWCK and a pre-pulse PREP, based on a write phase signal WPH. The first write latch input signal generation circuit 251 may buffer the first inverted division clock IBWCK to generate the first write latch clock WLCLK1, inversely buffer the pre-pulse PREP to generate the first write latch input signal WLIN1, and buffer the pre-pulse PREP to generate the first inverted write latch input signal WLIN1B when the write phase signal WPH is in a positive-phase state in which the write phase signal WPH is input at a logic "high" level. The first write latch input signal generation circuit 251 may set the first write latch clock WLCLK1 and the first write latch input signal WLIN1 to have a logic "low" level and set the first inverted write latch input signal WLIN1B to have a logic "high" level when the write phase signal WPH is in a negative-phase state in which the write phase signal WPH is input at a logic "low" level.

The first write latch circuit 253 may be connected to the first write latch input signal generation circuit 251 to receive the first write latch clock WLCLK1, the first write latch input signal WLIN1, and the first inverted write latch input signal WLIN1B from the first write latch input signal generation circuit 251. The first write latch circuit 253 may generate a first write pull-up signal WPU1 and a first write pull-down signal WPD1, based on the first write latch clock WLCLK1, the first write latch input signal WLIN1, and the first inverted write latch input signal WLIN1B. The first write latch circuit 253 may generate the first write pull-up signal, based on the first write latch clock WLCLK1 and the first write latch input signal WLIN1. As an example, the first write latch circuit 253 may generate the first write pull-up signal WPU1 that is activated to a logic "low" level when both the first write latch clock WLCLK1 and the first write latch input signal WLIN1 are at a logic "high" level. The first write latch circuit 253 may generate the first write pull-down signal WPD1, based on the first write latch clock WLCLK1 and the first inverted write latch input signal WLIN1B. As an example, the first write latch circuit 253 may generate the first write pull-down signal WPD1 that is activated to a logic "high" level when both the first write latch clock WLCLK1 and the first inverted write latch input signal WLIN1B are at a logic "high" level.

The first write drive circuit 255 may be connected to the first write latch circuit 253 to receive the first write pull-up signal WPU1 and the first write pull-down WPD1 from the write latch circuit 253. The first write drive circuit 255 may drive a first write control signal WCNT1, based on the first write pull-up signal WPU1 and the first write pull-down WPD1. The first write drive circuit 255 may pull-up drive the first write control signal WCNT1, based on the first write pull-up signal WPU1 and pull-down drive the first write control signal WCNT1, based on the first write pull-down WPD1. As an example, the first write drive circuit 255 may pull-up drive the first write control signal WCNT1 to a logic "high" level when the first write pull-up signal WPU1 is activated to a logic "low" level, and pull-down drive the first write control signal WCNT1 to a logic "low" level when the first write pull-down WPD1 is activated to a logic "high" level. The first write control signal latch 257 may latch the first write control signal WCNT1. The first write reset circuit 259 may initialize the first write control signal WCNT1, based on a reset signal RST that is activated during the initialization operation. As an example, the first write reset circuit 259 may initialize the first write control signal WCNT1 to a logic "low" level when the reset signal RST is activated to a logic "high" level.

The second write latch input signal generation circuit 261 may generate a second write latch clock WLCLK2, a second write latch input signal WLIN2, and a second inverted write latch input signal WLIN2B from a first division clock IWCK and the pre-pulse PREP, based on the write phase signal WPH. The second write latch input signal generation circuit 261 may buffer the first division clock IWCK to generate the second write latch clock WLCLK2, inversely buffer the pre-pulse PREP to generate the second write latch input signal WLIN2, and buffer the pre-pulse PREP to generate the second inverted write latch input signal WLIN2B when the write phase signal WPH is in a negative-phase state in which the write phase signal WPH is input at a logic "low" level. The second write latch input signal generation circuit 261 may set the second write latch clock WLCLK2 and the second write latch input signal WLIN2 to have a logic "low" level, and set the second inverted write latch input signal WLIN2B to have a logic "high" level when the write phase signal WPH is in a positive-phase state in which the write phase signal WPH is input at a logic "high" level.

The second write latch circuit 263 may be connected to the second write latch input signal generation circuit 261 to receive the second write latch clock WLCLK2, the second write latch input signal WLIN2, and the second inverted write latch input signal WLIN2B from the second write latch input signal generation circuit 261. The second write latch circuit 263 may generate a second write pull-up signal WPU2 and a second write pull-down signal WPD2, based on the second write latch clock WLCLK2, the second write latch input signal WLIN2, and the second inverted write latch input signal WLIN2B. The second write latch circuit 263 may generate the second write pull-up signal WPU2, based on the second write latch clock WLCLK2 and the second write latch input signal WLIN2. As an example, the second write latch circuit 263 may generate the second write pull-up signal WPU2 that is activated to a logic "low" level when both the second write latch clock WLCLK2 and the second write latch input signal WLIN2 are at a logic "high" level. The second write latch circuit 263 may generate the second write pull-down signal WPD2, based on the second write latch clock WLCLK2 and the second inverted write latch input signal WLIN2B. As an example, the second write latch circuit 263 may generate the second write pull-down signal WPD2 that is activated to a logic "high" level when both the second write latch clock WLCLK2 and the second inverted write latch input signal WLIN2B are at a logic "high" level.

The second write drive circuit 265 may be connected to the second write latch circuit 263 to receive the second write pull-up signal WPU2 and the second write pull-down signal WPD2 from the second write latch circuit 263. The second write drive circuit 265 may drive a second write control signal WCNT2, based on the second write pull-up signal WPU2 and the second write pull-down signal WPD2. The second write drive circuit 265 may pull-up drive the second write control signal WCNT2, based on the second write pull-up signal WPU2 and pull-down drive the second write control signal WCNT2, based on the second write pull-down signal WPD2. As an example, the second write drive circuit 265 may pull-up drive the second write control signal WCNT2 to a logic "high" level when the second write pull-up signal WPU2 is activated to a logic "low" signal, and pull-down drive the second write control signal WCNT2 to a logic "low" level when the second write pull-down signal WPD2 is activated to a logic "high" level. The second write control signal latch 267 may latch the second write control signal WCNT2. The second write reset circuit 269 may initialize the second write control signal WCNT2, based on the reset signal RST that is activated during the initialization operation. As an example, the second write reset circuit 269 may initialize the second write control signal WCNT2 to a logic "low" level when the reset signal RST is activated to a logic "high" level.

Figure 13:
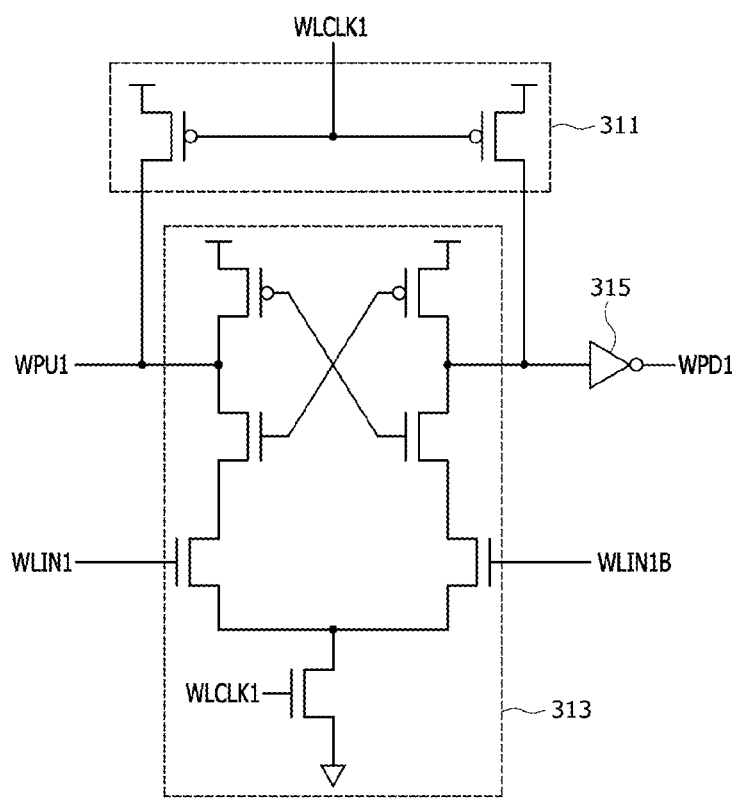
FIG. 13 is a circuit diagram according to an example of a first write latch circuit according to an embodiment of the present disclosure.

FIG. 13 is a circuit diagram of a first write latch circuit 253A according to an embodiment of the present disclosure. As shown in FIG. 13, the first write latch circuit 253A may include a write clock driver 311, a write differential driver 313, and an inversion buffer 315. The write clock driver 311 may drive a first write pull-up signal WPU1 to a logic "high" level and drive a first write pull-down signal WPD1 to a logic "low" level when a first write latch clock WLCLK1 is at a logic "low" level. The write differential driver 313 and the inversion buffer 315 may differentially amplify a first write latch input signal WLIN1 and a first inverted write latch input signal WLIN1B to drive the first write pull-up signal WPU1 and the first write pull-down signal WPD1 when the first write latch clock WLCLK1 is at a logic "high" level. The write differential driver 313 may generate the first write pull-up signal WPU1 that is activated to a logic "low" level when both the first write latch clock WLCLK1 and the first write latch input signal WLIN1 are at a logic "high" level. The write differential driver 313 and the inversion buffer 315 may generate the first write pull-down signal WPD1 that is activated to a logic "high" level when both the first write latch clock WLCLK1 and the first inverted write latch input signal WLIN1B are at a logic "high" level.

FIGS. 14 to 17 are timing diagrams illustrating an operation of a write control signal generation circuit 123A according to an embodiment of the present disclosure. An operation of the write control signal generation circuit 123A when a write operation is performed in a positive-phase state in a first clock mode, an operation of the write control signal generation circuit 123A when the write operation is performed in the positive-phase state in a second clock mode, an operation of the write control signal generation circuit 123A when the write operation is performed in a negative-phase state in the first clock mode, and an operation of the write control signal generation circuit 123A when the write operation is performed in the negative-phase state in the second clock mode will be described separately as follows with reference to FIGS. 14 to 17.

Figure 14:
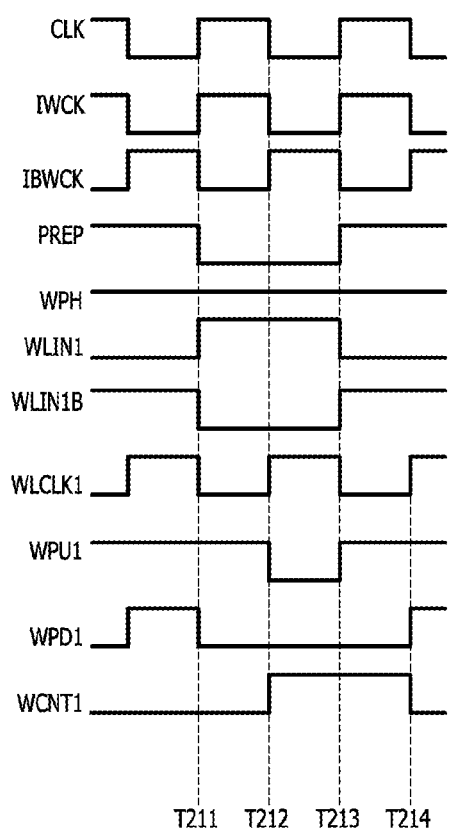
FIGS. 14, 15, 16, and 17 are timing diagrams illustrating an operation of a write control signal generation circuit according to an embodiment of the present disclosure.

As shown in FIG. 14, when the write operation is performed in the positive-phase mode in the first clock mode, a write phase signal WPH is set to have a logic "high" level and a pre-pulse PREP is generate at a logic "low" level during a section T211~T213. A first write latch input signal WLIN1 is generated at a logic "high" level by inversely buffering the pre-pulse PREP during the section T211~T213, and the first inverted write latch input signal WLIN1B is generated at a logic "low" level by buffering the pre-pulse PREP during the section T211~T213. A first write latch clock WLCLK1 is generated by buffering a first inverted division clock IBWCK. A first write pull-up signal WPU1 is activated to a logic "low" level during a section T212~T213 in which both the first write latch clock WLCLK1 and the first write latch input signal WLIN1 are at a logic "high" level. A first write pull-down signal WPD1 is activated to a logic "high" level from a time point T214 when both the first write latch clock WLCLK1 and the first inverted write latch input signal WLIN1B are at a logic "high" level. A first write control signal WCNT1 is generated at a logic "high" level during a section from a time point T212 when the first write pull-up signal WPU1 is activated to a logic "low" level to a time point T214 when the first write pull-down signal WPD1 is activated to a logic "high" level.

Figure 15:
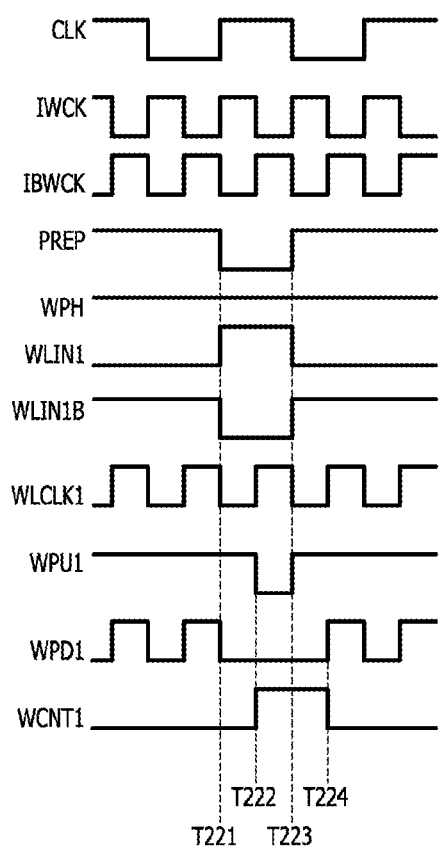

As shown in FIG. 15, when the write operation is performed in the positive-phase state in the second clock mode, the write phase signal WPH is set to have a logic "high" level and the pre-pulse PREP is generated at a logic "low" level during a section T221~T223. The first write latch input signal WLIN1 is generated at a logic "high" level by inversely buffering the pre-pulse PREP during a section T221~T223, and the second inverted write latch input signal WLIN2B is generated at a logic "low" level by buffering the pre-pulse PREP during a section T221~T223. The first write latch clock WLCLK1 is generated by buffering the first inverted division clock IBWCK. The first write pull-up signal WPU1 is activated to a logic "low" level during a section T222~T223 in which both the first write latch clock WLCLK1 and the first write latch input signal WLIN1 are at logic "high" level. The first write pull-down signal WPD1 is activated to a logic "high" level from a time point T224 when both the first write latch clock WLCLK1 and the first inverted write latch input signal WLIN1B are at logic "high" level. The first write control signal WCNT1 is generated at a logic "high" level from a time point T222 when the write pull-up signal WPU1 is activated to a logic "low" level to a time point T224 when the first write pull-down WPD1 is activated to a logic "high" level.

Figure 16:
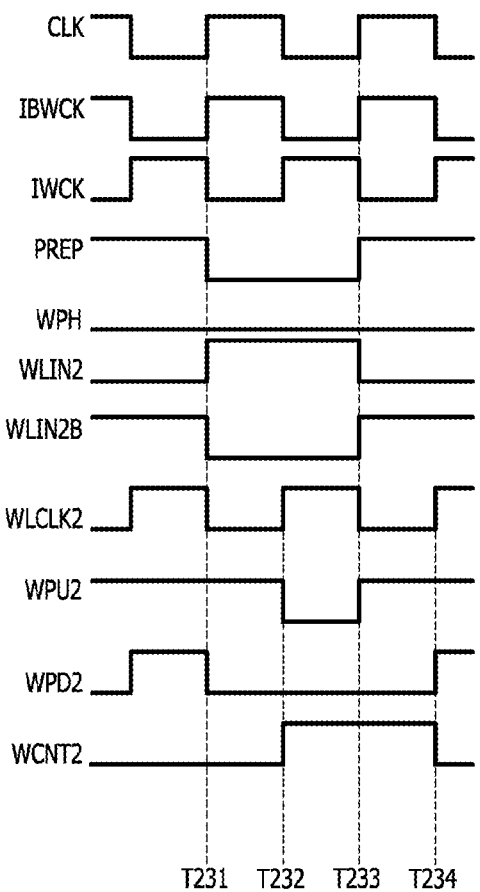

As shown in FIG. 16, when the write operation is performed in the negative-phase state in the first clock mode, the write phase signal WPH is set to have a logic "low" level, and the pre-pulse PREP is generated at a logic "low" level during a section T231~T233. The second write latch input signal WLIN2 is generated at a logic "high" level by inversely buffering the pre-pulse PREP during the section T231~T233, and the second inverted write latch input signal WLIN2B is generated at a logic "low" level by buffering the pre-pulse PREP during the section T231~T233. The second write latch clock WLCLK2 is generated by buffering the first division clock IWCK. The second write pull-up signal WPU2 is activated to a logic "low" level during a section T232~T233 when both the second write latch clock WLCLK2 and the second write latch input signal WLIN2 are at a logic "high" level. The second write pull-down signal WPD2 is activated to a logic "high" level from a time point T234 in which both the second write latch clock WLCLK2 and the second inverted write latch input signal WLIN2B are at a logic "high" level. The second write control signal WCNT2 is generated at a logic "high" level during a section from a time point T232 in which the second write pull-up signal WPU2 is activated to a logic "low" level to a time point T234 when the second write pull-down signal WPD2 is activated to a logic "high" level.

Figure 17:
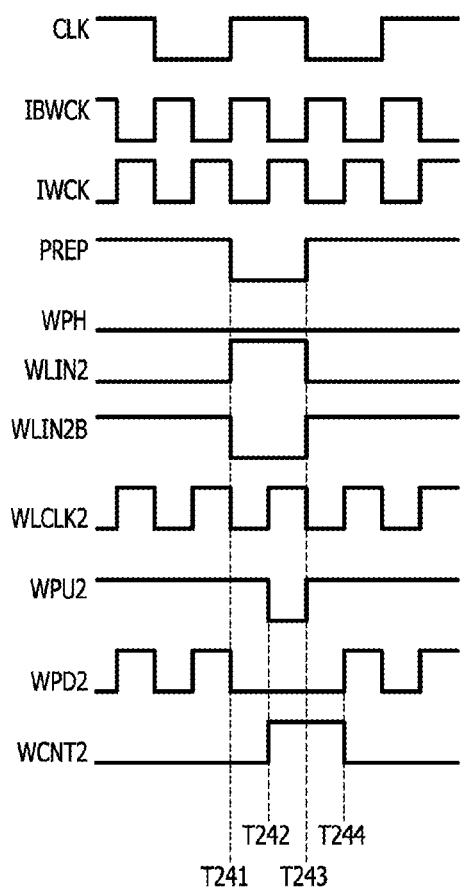

As shown in FIG. 17, the write operation is performed in the negative-phase state in the second clock mode, the write phase signal WPH is set to have a logic "low" level and the pre-pulse PREP is generated at a logic "low" level during a section T241~T243. The second write latch input signal WLIN2 is generated at a logic "high" level by inversely buffering the pre-pulse PREP during the section T241~T243, and the second inverted write latch input signal WLIN2B is generated at a logic "low" level by buffering the pre-pulse PREP during the section T241~T243. The second write latch clock WLCLK2 is generated by buffering first division clock IWCK. The second write pull-up signal WPU2 is activated to a logic "low" level during a section T242~T243 in which both the second write latch clock WLCLK2 and the second write latch input signal WLIN2 are at a logic "high" level. The second write pull-down signal WPD2 is activated to a logic "high" level from a time point T244 in which both the second write latch clock WLCLK2 and the second inverted write latch input signal WLIN2B are at a logic "high" level. The second write control signal WCNT2 is generated at a logic "high" level during a section from a time point T242 when the second write pull-up signal WPU2 is activated to a logic "low" level to a time point T244 when the second write pull-down signal WPD2 is activated to a logic "high" level.

Figure 18:
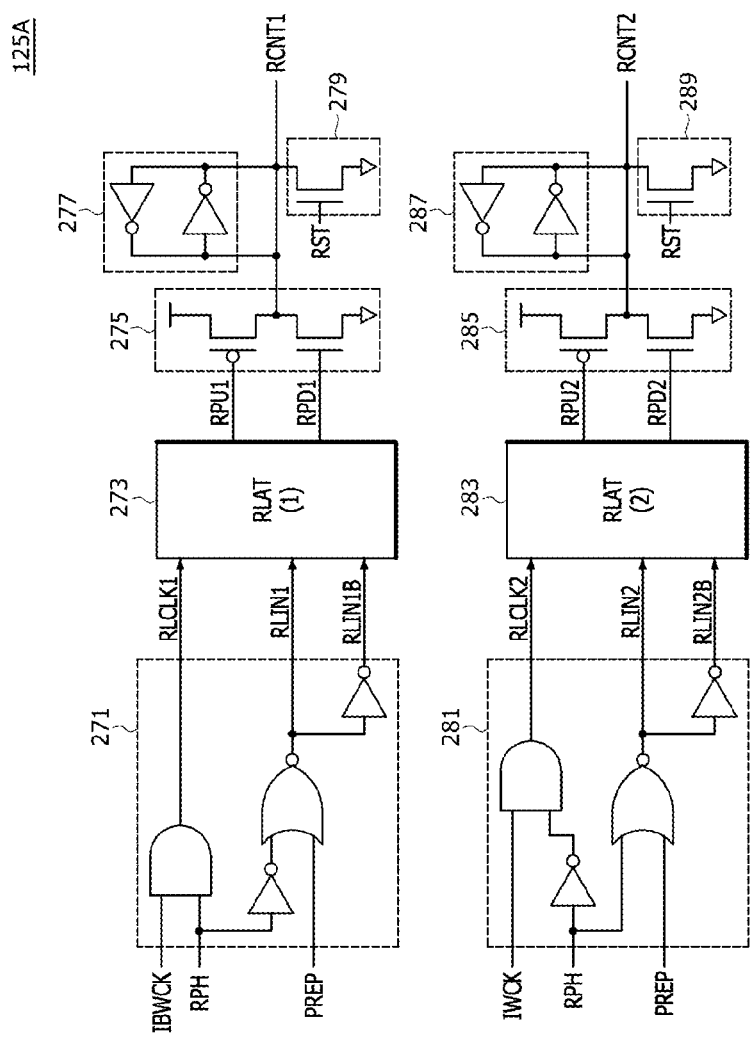
FIG. 18 is a diagram illustrating a configuration of a read control signal generation circuit according to an embodiment of the present disclosure.

FIG. 18 is a diagram illustrating a configuration of a read control signal generation circuit 125A according to an embodiment of the present disclosure. As shown in FIG. 18, the read control signal generation circuit 125A may include a first read latch input signal generation circuit 271, a first read latch circuit 273, a first read drive circuit 275, a first read control signal latch 277, a first read reset circuit 279, a second read latch input signal generation circuit 281, a second read latch circuit 283, a second read drive circuit 285, a second read control signal latch 287, and a second read reset circuit 289.

The first read latch input signal generation circuit 271 may generate a read latch clock RLCLK1, a first read latch input signal RLIN1, and a first inverted read latch input signal RLIN1B from a first inverted division clock IBWCK and a pre-pulse PREP, based on a read phase signal RPH. The first read latch input signal generation circuit 271 may buffer the first inverted division clock IBWCK to generate the first read latch clock RLCLK1, inversely buffer the pre-pulse PREP to generate the first read latch input signal RLIN1, and buffer the pre-pulse PREP to generate the first inverted read latch input signal RLIN1B when the read phase signal RPH is in a positive-phase state in which the read phase signal RPH is input at a logic "high" level. The first read latch input signal generation circuit 271 may set the first read latch clock RLCLK1 and the first read latch input signal RLIN1 to have a logic "low" level and set the first inverted read latch input signal RLIN1B to have a logic "high" level when the read phase signal RPH is in a negative-phase state in which the read phase signal RPH is input at a logic "low" level.

The first read latch circuit 273 may be connected to the first read latch input signal generation circuit 271 to receive the first read latch clock RLCLK1, the first read latch input signal RLIN1, and the first inverted read latch input signal RLIN1B from the first read latch input signal generation circuit 271. The first read latch circuit 273 may generate a first read pull-up signal RPU1 and a first read pull-down signal RPD1, based on the first read latch clock RLCLK1, the first read latch input signal RLIN1, and the first inverted read latch input signal RLIN1B. The first read latch circuit 273 may generate the first read pull-up signal RPU1, based on the first read latch clock RLCLK1 and the first read latch input signal RLIN1. As an example, the first read latch circuit 273 may generate the first read pull-up signal RPU1 that is activated to a logic "low" level when both the first read latch clock RLCLK1 and the first read latch input signal RLIN1 are at a logic "high" level. The first read latch circuit 273 may generate the first read pull-down signal RPD1, based on the first read latch clock RLCLK1 and the first inverted read latch input signal RLIN1B. As an example, the first read latch circuit 273 may generate the read pull-down signal RPD1 that is activated to a logic "high" level when both the first read latch clock RLCLK1 and the first inverted read latch input signal RLIN1B are at a logic "high" level.

The first read drive circuit 275 may be connected to the first read latch circuit 273 to receive the first read pull-up signal RPU1 and the first read pull-down signal RPD1 from the first read latch circuit 273. The first read drive circuit 275 may drive the first read control signal RCNT1, based on the first read pull-up signal RPU1 and the first read pull-down signal RPD1. The first read drive circuit 275 may pull-up drive the first read control signal RCNT1, based on the first read pull-up signal RPU1 and pull-down drive the first read control signal RCNT1, based on the first read pull-down signal RPD1. As an example, the first read drive circuit 275 may pull-up drive the first read control signal RCNT1 to a logic "high" level when the first read pull-up signal RPU1 is activated to a logic "low" level and pull-down drive the first read control signal RCNT1 to a logic "low" level when the first read pull-down signal RPD1 is activated to a logic "high" level. The first read control signal latch 277 may latch the first read control signal RCNT1. The first read reset circuit 279 may initialize the first read control signal RCNT1, based on a reset signal RST that is activated during the initialization operation. As an example, the first read reset circuit 279 may initialize the first read control signal RCNT1 to a logic "low" level when the reset signal RST is activated to a logic "high" level.

The second read latch input signal generation circuit 281 may generate a second read latch clock RLCLK2, a second read latch input signal RLIN2, and a second inverted read latch input signal RLIN2B from the first division clock IWCK and the pre-pulse PREP, based on the read phase signal RPH. The second read latch input signal generation circuit 281 may buffer the first division clock IWCK to generate the read latch clock RLCLK2, inversely buffer the pre-pulse PREP to generate the second read latch input signal RLIN2, and buffer the pre-pulse PREP to generate the second inverted read latch input signal RLIN2B when the read phase signal RPH is in a negative-phase state in which the read phase signal RPH is input at a logic "low" level. The second read latch input signal generation circuit 281 may set the second read latch clock RLCLK2 and the second read latch input signal RLIN2 to a logic "low" level and set the second inverted read latch input signal RLIN2B to a logic "high" level when the read phase signal RPH is in a positive-phase state in which the read phase signal RPH is input at a logic "high" level.

The second read latch circuit 283 may be connected to the second read latch input signal generation circuit 281 to receive the second read latch clock RLCLK2, the second read latch input signal RLIN2, and the second inverted read latch input signal RLIN2B from the second read latch input signal generation circuit 281. The second read latch circuit 283 may generate a second read pull-up signal RPU2 and a second read pull-down signal RPD2, based on the second read latch clock RLCLK2, the second read latch input signal RLIN2, and the second inverted read latch input signal RLIN2B. The second read latch circuit 283 may generate the second read pull-up signal, based on the second read latch clock RLCLK2 and the second read latch input signal RLIN2. As an example, the second read latch circuit 283 may generate the second read pull-up signal RPU2 that is activated to a logic "low" level when both the second read latch clock RLCLK2 and the second read latch input signal RLIN2 are at a logic "high" level. The second read latch circuit 283 may generate the second read pull-down signal RPD2, based on the second read latch clock RLCLK2 and the second inverted read latch input signal RLIN2B. As an example, the second read latch circuit 283 may generate the second read pull-down signal RPD2 that is activated to a logic "high" level when both the second read latch clock RLCLK2 and the second inverted read latch input signal RLIN2B are at a logic "high" level.

The second read drive circuit 285 may be connected to the second read latch circuit 283 to receive the second read pull-up signal RPU2 and the second read pull-down signal RPD2 from the second read latch circuit 283. The second read drive circuit 285 may drive the second read control signal RCNT2, based on the second read pull-up signal RPU2 and the second read pull-down signal RPD2. The second read drive circuit 285 may pull-up drive the second read control signal RCNT2, based on the second read pull-up signal RPU2 and pull-down drive the second read control signal RCNT2, based on the second read pull-down signal RPD2. As an example, the second read drive circuit 285 may pull-up drive the second read control signal RCNT2 to a logic "high" level when the second read pull-up signal RPU2 is activated to a logic "low" level and pull-down drive the second read control signal RCNT2 to a logic "low" level when the second read pull-down signal RPD2 is activated to a logic "high" level. The second read control signal latch 287 may latch the second read control signal RCNT2. The second read reset circuit 289 may initialize the second read control signal RCNT2, based on the reset signal RST that is activated during the initialization operation. As an example, the second read reset circuit 289 may initialize the second read control signal RCNT2 to a logic "low" level when the reset signal RST is activated to a logic "high" level.

FIGS. 19 to 22 are timing diagrams illustrating an operation of a read control signal generation circuit 125A. An operation of the read control signal generation circuit 125A when a read operation is performed in a positive-phase state in a first clock mode, an operation of the read control signal generation circuit 125A when the read operation is performed in the positive-phase state in a second clock mode, an operation of the read control signal generation circuit 125A when the read operation is performed in a negative-phase state in the first clock mode, an operation of the read control signal generation circuit 125A when the read operation is performed in the negative-phase state in the second clock mode will be described separately with reference to FIGS. 19 to 22.

Figure 19:
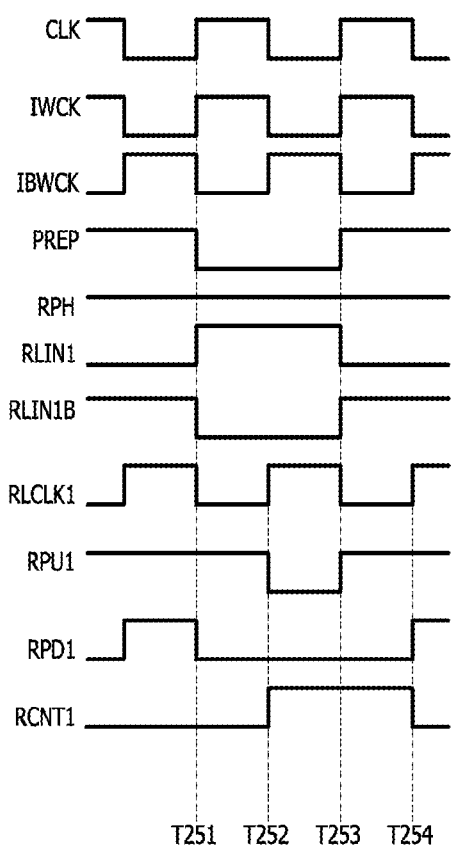
FIGS. 19, 20, 21, and 22 are timing diagrams illustrating an operation of a read control signal generation circuit according to an embodiment of the present disclosure.

As shown in FIG. 19, when the read operation is performed in the positive-phase state in the first clock mode, a read phase signal RPH is set to have a logic "high" level and a pre-pulse PREP is generated at a logic "low" level during a section T251~T253. A first read latch input signal RLIN1 is generated at a logic "high" level by inversely buffering the pre-pulse PREP during a section T251~T253, and a first inverted read latch input signal RLIN1B is generated at a logic "low" level by buffering the pre-pulse PREP during the section T251~T253. A first read latch clock RLCLK1 is generated by buffering a first inverted division clock IBWCK. A first read pull-up signal RPU1 is activated to a logic "low" level during a section T252~T253 in which both the first read latch clock RLCLK1 and the first read latch input signal RLIN1 are at a logic "high" level. A first read pull-down signal RPD1 is activated to a logic "high" level from a time point T254 when both the first read latch clock RLCLK1 and the first inverted read latch input signal RLIN1B are at a logic "high" level. A first read control signal RCNT1 is generated at a logic "high" level during a section from a time point T252 when the first read pull-up signal RPU1 is activated to a logic "low" level to a time point T254 when the first read pull-down signal RPD1 is activated to a logic "high" level.

Figure 20:
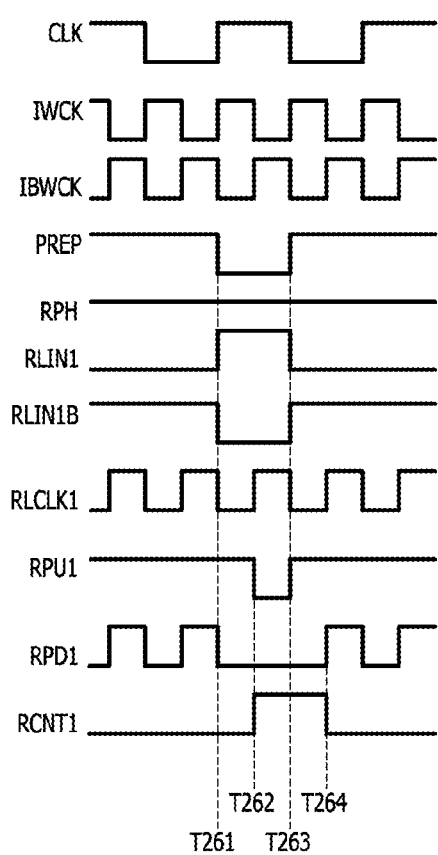

As shown in FIG. 20, when the read operation is performed in the positive-phase state in the second clock mode, the read phase signal RPH is set to have a logic "high" level, and the pre-pulse PREP is set to have a logic "low" level during a section T261~T263. The first read latch input signal RLIN1 is generated at a logic "high" level by inversely buffering the pre-pulse PREP during the section T261~T263, and the second inverted read latch input signal RLIN2B is generated to a logic "low" level by buffering the pre-pulse PREP during the section T261~T263. The first read latch input clock RLCLK1 is generated by buffering the first inverted division clock IBWCK. The first read pull-up signal RPU1 is activated to a logic "low" level during a section T262~T263 in which both the first read latch clock RLCLK1 and the first read latch input signal RLIN1 are at logic "high" level. The first read pull-down signal WPD1 is activated to a logic "high" level from a time point T264 at which both the first read latch clock RLCLK1 and the first inverted read latch input signal RLIN1B are at a logic "high" level. The first read control signal RCNT1 is generated at a logic "high" level during a section from a time point T262 at which the first read pull-up signal RPU1 is activated to a logic "low" level to a time point T264 at which the first read pull-down signal RPD1 is activated to a logic "high" level.

Figure 21:
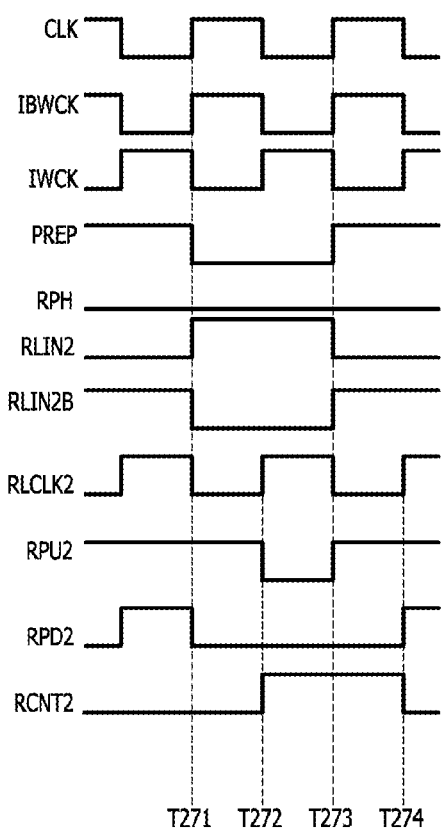

As shown in FIG. 21, when the read operation is performed in the negative-phase state in the first clock mode, the read phase-signal RPH is set to have a logic "low" level, and the pre-pulse PREP is generated at a logic "low" level during a section T271~T273. The second read latch input signal RLIN2 is generate at a logic "high" level by inversely buffering the pre-pulse PREP during the section T271~T273, and the second inverted read latch input signal RLIN2B is generated at a logic "low" level by buffering the pre-pulse PREP during the section T271~T273. The second read latch clock RLCLK2 is generated by buffering the first division clock IWCK. The second read pull-up signal RPU2 is activated to a logic "low" level during a section T272~T273 in which both the second read latch clock RLCLK2 and the second read latch input signal RLIN2 are at a logic "high" level. The second read pull-down signal RPD2 is activated to a logic "high" level from a time point T274 at which both the second read latch clock RLCLK2 and the second inverted read latch input signal RLIN2B are at a logic "high" level. A second read control signal RCNT2 is generated at a logic "high" level during a section from a time point T272 at which the second read pull-up signal RPU2 is activated to a logic "low" level to a time point T274 at which the second read pull-down signal RPD2 is generated at a logic "high" level.

Figure 22:
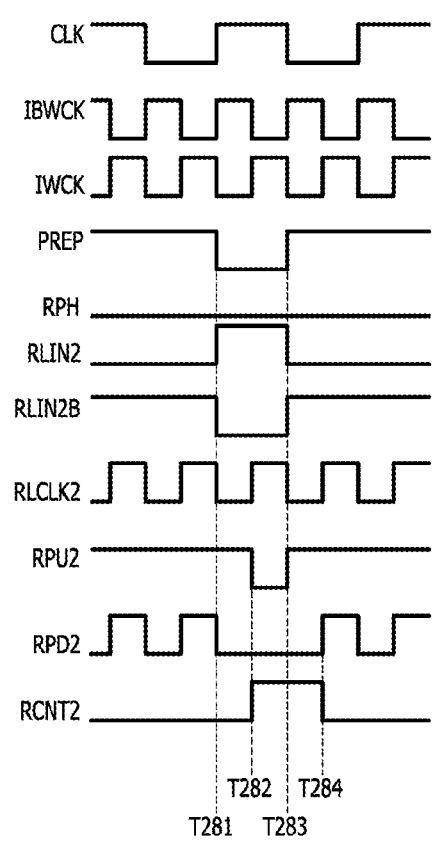

As shown in FIG. 22, when the read operation is performed in the negative-phase state in the second clock mode, the read phase-signal RPH is set to have a logic "low" level, and the pre-pulse PREP is generated at a logic "low" level during a section T281~T283. The second read latch input signal RLIN2 is generate at a logic "high" level by inversely buffering the pre-pulse PREP during the section T281~T283, and the second inverted read latch input signal RLIN2B is generated at a logic "low" level by buffering the pre-pulse PREP during the section T281~T283. The second read latch clock RLCLK2 is generated by buffering the first division clock IWCK. The second read pull-up signal RPU2 is activated to a logic "low" level during a section T282~T283 in which both the second read latch clock RLCLK2 and the second read latch input signal RLIN2 are at a logic "high" level. The second read pull-down signal RPD2 is activated to a logic "high" level from a time point T284 at which both the second read latch clock RLCLK2 and the second inverted read latch input signal RLIN2B are at a logic "high" level. The second read control signal RCNT2 is generated at a logic "high" level during a section from a time point T282 at which the second read pull-up signal RPU2 is activated to a logic "low" level to a time point T284 at which the second read pull-down signal RPD2 is activated to a logic "high" level.

Figure 23:
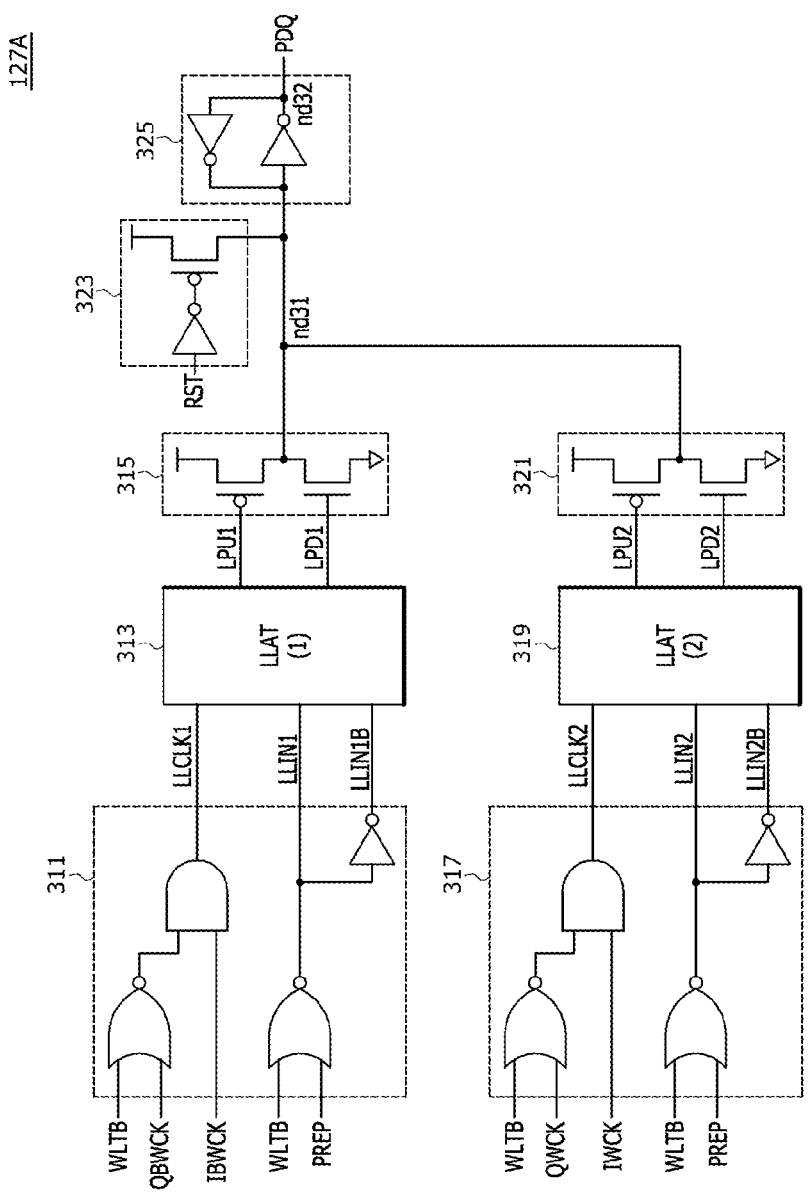
FIG. 23 is a diagram illustrating a configuration of a write leveling control circuit according to an embodiment of the present disclosure.

FIG. 23 is a diagram illustrating a configuration of a write leveling control circuit 127A according to an embodiment of the present disclosure. As shown in FIG. 23, the write leveling control circuit 127A may include a first leveling latch input signal generation circuit 311, a first leveling latch circuit 313, a first leveling drive circuit 315, a second leveling latch input signal generation circuit 317, a second leveling latch circuit 319, a second leveling drive circuit 321, a detection data reset circuit 323, and a detection data latch 325.

The first leveling latch input signal generation circuit 311 may generate a first leveling latch clock LLCLK1, a first leveling latch input signal LLIN1, and a first inverted leveling latch input signal LLIN1B from a first inverted division clock IBWCK, a second inverted division clock QBWCK, and a pre-pulse PREP, based on a write leveling activation signal WLTB. When a write leveling operation is performed and a write leveling activation signal WLTB that is enabled having a logic "low" level is input, the first leveling latch input signal generation circuit 311 may output a logical AND operation result of an inverted signal of the second inverted division clock QBWCK and the first inverted division clock IBWCK as the first leveling latch clock LLCLK1, inversely buffer the pre-pulse PREP to generate the first leveling latch input signal LLIN1, and buffer the pre-pulse PREP to generate the first inverted leveling latch input signal LLIN1B. The first leveling latch input signal generation circuit 311 may set the first leveling latch clock LLCLK1 and the first leveling latch input signal LLIN1 to have a logic "low" level and set the first inverted leveling latch input signal LLIN1B to have a logic "high" level when the write leveling operation is not performed and the write leveling activation signal WLTB of a logic "high" level is input.

The first leveling latch circuit 313 may be connected to the first leveling latch input signal generation circuit 311 to receive the first leveling latch clock LLCLK1, the first leveling latch input signal LLIN1, and the first inverted leveling latch input signal LLIN1B from the first leveling latch input signal generation circuit 311. The first leveling latch circuit 313 may generate a first leveling pull-up signal LPU1 and a first leveling pull-down signal LPD1, based on the first leveling latch clock LLCLK1, the first leveling latch input signal LLIN1, and the first inverted leveling latch input signal LLIN1B. The first leveling latch circuit 313 may generate the first leveling pull-up signal LPU1, based on the first leveling latch clock LLCLK1 and the first leveling latch input signal LLIN1. As an example, first leveling latch circuit 313 may generate the first leveling pull-up signal LPU1 that is activated to a logic "low" level when both the first leveling latch clock LLCLK1 and the first leveling latch input signal LLIN1 are at a logic "high" level. The first leveling latch circuit 313 may generate the first leveling pull-down signal LPD1, based on the first leveling latch clock LLCLK1 and the first inverted leveling latch input signal LLIN1B. As an example, first leveling latch circuit 313 may generate the first leveling pull-down signal LPD1 that is activated to a logic "high" level when both the first leveling latch clock LLCLK1 and the first inverted leveling latch input signal LLIN1B are at a logic "high" level.

The first leveling drive circuit 315 may be connected to the first leveling latch circuit 313 to receive the first leveling pull-up signal LPU1 and the first leveling pull-down signal LPD1 from the first leveling latch circuit 313. The first leveling drive circuit 315 may drive a signal of a node nd31, based on the first leveling pull-up signal LPU1 and the first leveling pull-down signal LPD1. The first leveling drive circuit 315 may pull-up drive the signal of the node nd31, based on the first leveling pull-up signal LPU1 and pull-down drive the signal of the node n31, based on the first leveling pull-down signal LPD1. As an example, the first leveling drive circuit 315 may pull-up drive the signal of the node nd31 when the first leveling pull-up signal LPU1 is activated to a logic "low" level and pull-down drive the signal of the node n31 when the first leveling pull-down signal LPD1 is activated to a logic "high" level. detection data The second leveling latch input signal generation circuit 317 may generate a second leveling latch clock LLCLK2, a second leveling latch input signal LLIN2, and a second inverted leveling latch input signal LLIN2B from the first division clock IWCK, the second division clock QWCK, the pre-pulse PREP, based on the write leveling activation signal WLTB. When a write leveling operation is performed and the write leveling activation signal WLTB of a logic "low" level is input, the second leveling latch input signal generation circuit 317 may output a logical AND operation result of an inverted signal of the second division clock QWCK and the first division clock IWCK as the second leveling latch clock LLCLK2, inversely buffer the pre-pulse PREP to generate the second leveling latch input signal LLIN2, and buffer the pre-pulse PREP to generate the second inverted leveling latch input signal LLIN2B. When a write leveling operation is not performed and the write leveling activation signal WLTB of a logic "high" level is input, the second leveling latch input signal generation circuit 317 may set the second leveling latch clock LLCLK2 and the second leveling latch input signal LLIN2 to have a logic "low" level and set the second inverted leveling latch input signal LLIN2B to a have logic "high" level.

The second leveling latch circuit 319 may be connected to the second leveling latch input signal generation circuit 317 to receive the second leveling latch clock LLCLK2, the second leveling latch input signal LLIN2, and the second inverted leveling latch input signal LLIN2B from the second leveling latch input signal generation circuit 317. The second leveling latch circuit 319 may generate a second leveling pull-up signal LPU2 and a second leveling pull-down signal LPD2, based on the second leveling latch clock LLCLK2, the second leveling latch input signal LLIN2, and the second inverted leveling latch input signal LLIN2B. The second leveling latch circuit 319 may generate the second leveling pull-up signal LPU2, based on the second leveling latch clock LLCLK2 and the second leveling latch input signal LLIN2. As an example, the second leveling latch circuit 319 may generate the second leveling pull-up signal LPU2 that is activated to a logic "low" level when both the second leveling latch clock LLCLK2 and the second leveling latch input signal LLIN2 are at a logic "high" level. The second leveling latch circuit 319 may generate the second leveling pull-down signal LPD2, based on the second leveling latch clock LLCLK2 and the second inverted leveling latch input signal LLIN2B. As an example, the second leveling latch circuit 319 may generate the second leveling pull-down signal LPD2 that is activated to a logic "high" level when both the second leveling latch clock LLCLK2 and the second inverted leveling latch input signal LLIN2B are at a logic "high" level.

The second leveling drive circuit 321 may be connected to the second leveling latch circuit 319 to receive the second leveling pull-up signal LPU2 and the second leveling pull-down signal LPD2 from the second leveling latch circuit 319. The second leveling drive circuit 321 may drive the signal of the node nd31, based on the second leveling pull-up signal LPU2 and the second leveling pull-down signal LPD2. The second leveling drive circuit 321 may pull-up drive the signal of the node nd31, based on the second leveling pull-up signal LPU2 and pull-down drive the signal of the node nd31, based on the second leveling pull-down signal LPD2. As an example, the second leveling drive circuit 321 may pull-up drive the signal of the node nd31 when the second leveling pull-up signal LPU2 is activated to a logic "low" level and pull-down drive the signal of the node nd31 when the second leveling pull-down signal LPD2 is activated to a logic "high" level. The detection data reset circuit 323 may initialize the signal of the node nd31, based on a reset signal RST that is activated during the initialization operation. As an example, the detection data reset circuit 323 may initialize the signal of the node nd31 to a logic "high" level when the reset signal RST is activated to a logic "high" level. The detection data latch 325 may inversely buffer the signal of the node nd31 to output detection data PDQ through a node nd32. The detection data latch 325 may latch the signal of the node nd31 and the detection data PDQ.

Figure 24:
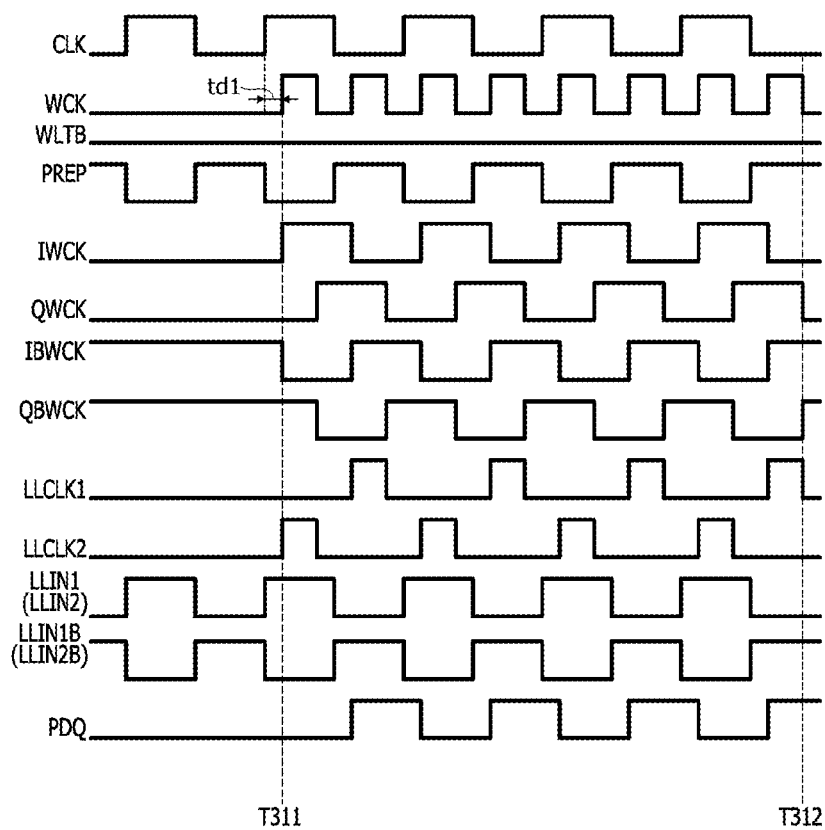
FIGS. 24 and 25 are timing diagrams illustrating an operation of the write leveling control circuit illustrated in FIG. 23.
Figure 25:
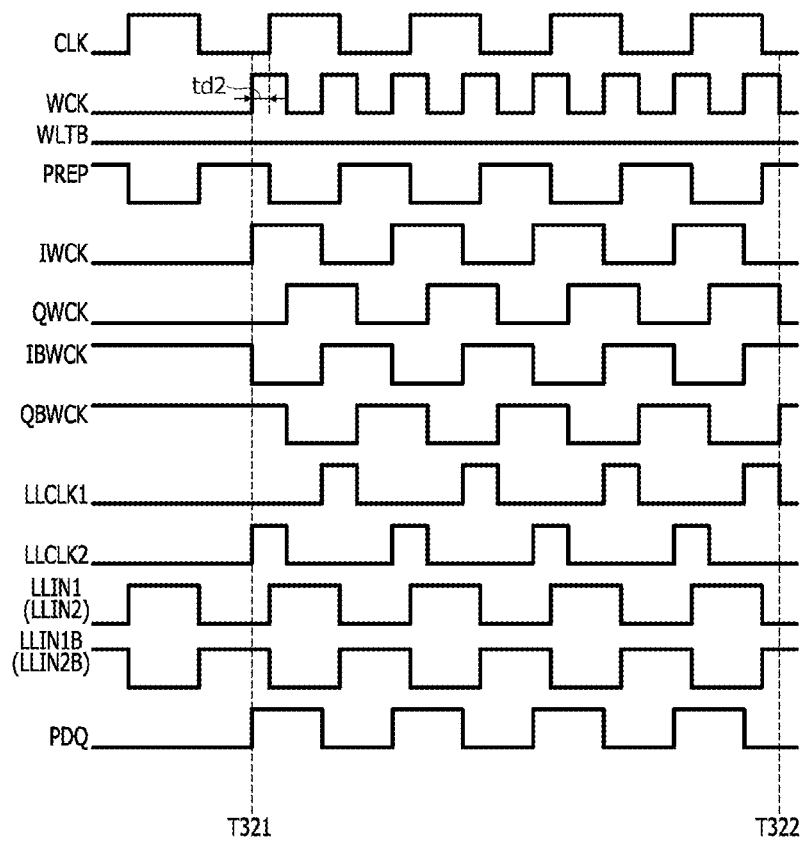

FIGS. 24 and 25 are timing diagrams illustrating a write leveling operation performed by a write leveling control circuit 127A. The write leveling operation may be performed in a state in which the frequency ratio of a system clock CLK and a data clock WCK is set to 1:2.

As shown in FIG. 24, when the write leveling operation is performed in a state in which the phase of the data clock WCK is set to be later than the phase of the system clock CLK by the section td1, a first leveling latch clock LLCLK1 is set to have a logic "high" level when a second inverted division clock QBWCK is at a logic "low" level and a first inverted division clock IBWCK is at a logic "high" level, and the second leveling latch clock LLCLK2 is set to have a logic "high" level when a second division clock QWCK is at a logic "low" level and a first division clock IWCK is at a logic "high" level. In addition, when the write leveling operation is performed, a first leveling latch input signal LLIN1 and a second leveling latch input signal LLIN2 are generated by inversely buffering the pre-pulse PREP, and a first inverted leveling latch input signal LLIN1B and a second inverted leveling latch input signal LLIN2B are generated by buffering the pre-pulse PREP. Detection data PDQ is pull-up driven when both the first leveling latch clock LLCLK1 and the first inverted leveling latch input signal LLIN1B are at a logic "high" level and pull-down driven when both the second leveling latch clock LLCLK2 and the second leveling latch input signal LLIN2 are at logic "high" level. The write leveling operation is performed in such a way that the detection data PDQ is generated during a section T311~T312 in which the data clock WCK toggles. The section T311~T312 may be set as a write leveling section having a 7.5 cycle section (7.5 tCK) of the data clock WCK. At a time point T312 when the write leveling operation is finished, the detection data PDQ is generated at a logic "high" level. The controller (11 in FIG. 1) may receive the detection data PDQ of a logic "high" level, confirm that the phase of the data clock WCK is set to be later than the phase of the system clock CLK, and change the phase of the data clock WCK to be faster to apply the changed phase to the semiconductor device (13 of FIG. 1).

As shown in FIG. 25, when the write leveling operation is performed in a state in which the phase of the data clock WCK is set to be faster than the phase of the system clock CLK by a section td2, the first leveling latch clock LLCLK1 is set to have a logic "high" level when the second inverted division clock QBWCK is at a logic "low" level and the first inverted division clock IBWCK is at a logic "high" level, and the second leveling latch clock LLCLK2 is set to have a logic "high" level when the second division clock QWCK is at a logic "low" level and the first division clock IWCK is at a logic "high" level. In addition, when a write leveling operation is performed, the first leveling latch input signal LLIN1 and the second leveling latch input signal LLIN2 are generated by inversely buffering the pre-pulse PREP, and the first inverted leveling latch input signal LLIN1B and the second inverted leveling latch input signal LLIN2B are generated by buffering the pre-pulse PREP. The detection data PDQ is pull-up driven to a logic "high" level when both the second leveling latch clock LLCLK2 and the second inverted leveling latch input signal LLIN2B are at a logic "high" level, and pulled-down driven to a logic "low" level when both the first leveling latch clock LLCLK1 and the first leveling latch input signal LLIN1 are at a logic "high" level. The write leveling operation is performed in such a way that the detection data PDQ is generated during a section T321~T322 in which the data clock WCK toggles. The section T321~T322 may be set as a write leveling section having a 7.5 cycle section (7.5 tCK) of the data clock WCK. At a time point T322 when the write leveling operation is finished, the detection data PDQ is generated at a logic "low" level. The controller (11 in FIG. 1) may receive the detection data PDQ of a logic "low" level, confirm that the phase of the data clock WCK is set to be faster than the phase of the system clock CLK, and change the phase of the data clock WCK to be slower to apply the changed phase to the semiconductor device (13 of FIG. 1).

In the semiconductor system 1 configured as described above in an embodiment, since normal operations including write operation and read operation and a write leveling operation are performed based on the same pre-pulse PREP, mismatch between the normal operation and the write leveling operation can be minimized.

Figure 26:
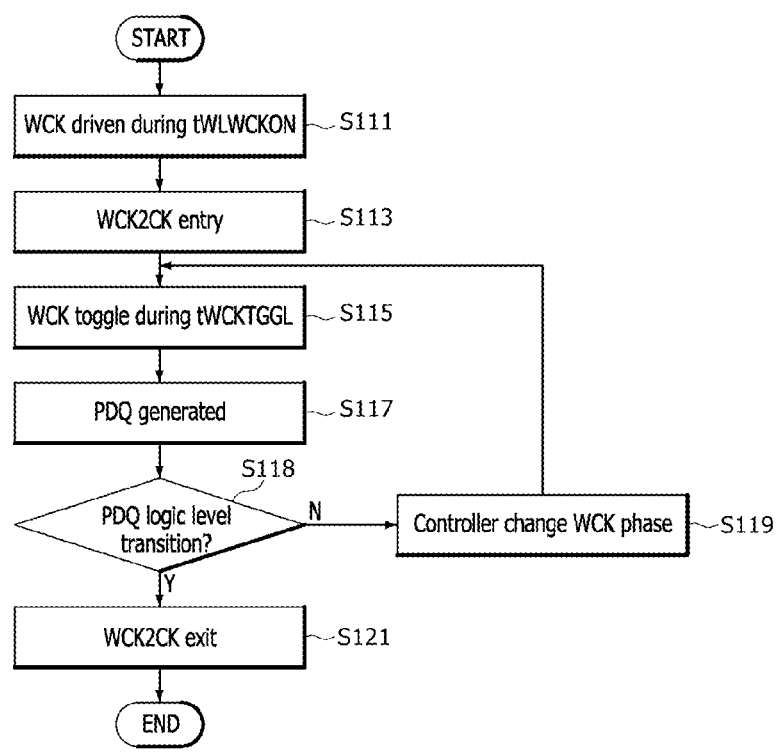
FIGS. 26, 27, and 28 are timing diagrams illustrating a write leveling operation according to an embodiment of the present disclosure.
Figure 27:
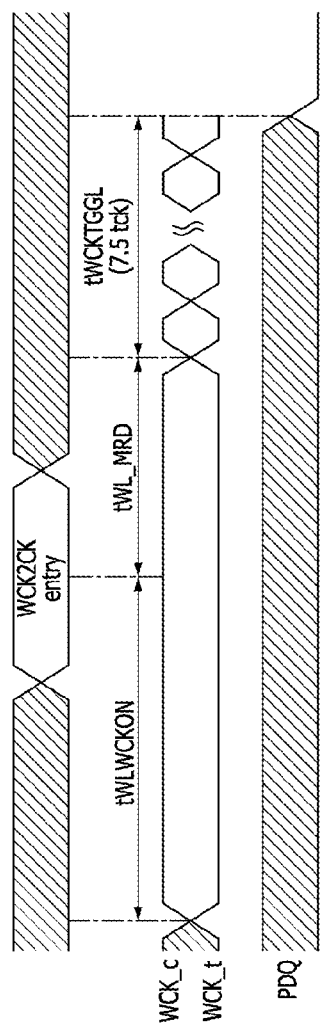
Figure 28:
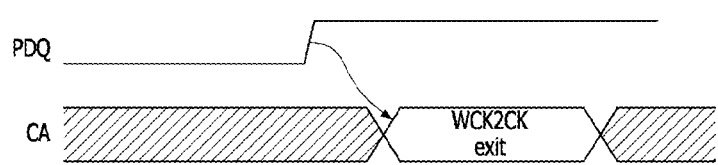

FIGS. 26 to 28 are diagrams illustrating a write leveling operation according to an embodiment of the present disclosure.

Referring to FIGS. 26 and 27, during a first waiting section tWLWCKON before entering a write leveling operation (WCK2CK entry), data clocks WCK_c and WCK_t are driven to a preset logic level (S111) and applied to a semiconductor device (13 in FIG. 1) from a controller (11 in FIG. 1). After entering the write leveling operation WCK2CK (S113), the data clocks WCK_c and WCK_t maintain the preset logic level during a second waiting section tWL_MRD. After the second waiting section tWL_MRD has elapsed, the data clocks WCK_c and WCK_t are toggled (S115) during a write leveling section tWCKTGGL set to a 7.5 cycle section (7.5 tCK). Detection data PDQ is generated based on the information on the phase difference between the data clocks WCK_c and WCK_t and a system clock CLK during the write leveling section tWCKTGGL (S117). It is determined whether the logic level of the detection data PDQ has transitioned (S118). When the logic level of the detection data PDQ has not transitioned, the controller (11 of FIG. 1) changes the phases of the data clocks WCK_c and WCK_t, based on the detection data PDQ (S119). The series of operations (S115, S117, S118, and S119) in which the controller (11 in FIG. 1) changes the phases of the data clocks WCK_c and WCK_t, based on the detection data PDQ during the section in which the logic level of the detection data PDQ has transitioned are repeatedly performed.

Referring to FIGS. 26 and 28, the controller (11 of FIG. 1) may control the semiconductor device (13 of FIG. 1) to exit the write leveling operation (WCK2CK exit) when the logic level of the detection data PDQ has transitioned (S121).

Concepts have been disclosed in conjunction with some embodiments as described above. Those skilled in the art will appreciate that various modifications, additions, and substitutions are possible, without departing from the scope and spirit of the present disclosure. Accordingly, the embodiments disclosed in the present specification should be considered from not a restrictive standpoint but rather from an illustrative standpoint. The scope of the concepts is not limited to the above descriptions but defined by the accompanying claims, and all of distinctive features in the equivalent scope should be construed as being included in the concepts.

What is claimed is:

1. A semiconductor device comprising:
    a pre-pulse generation circuit configured to generate a pre-pulse, based on a write/read shifting pulse and a write leveling activation signal;
    a write/read control signal generation circuit configured to generate a write/read control signal, based on the pre-pulse and a division clock; and
    a write leveling control circuit configured to generate detection data including information on a phase difference between a data clock and a system clock, based on the pre-pulse and the division clock,
    wherein a pulse width of the pre-pulse is set based on a frequency ratio of the system clock and the data clock when a write/read operation is performed.

2. The semiconductor device of claim 1, further comprising a write/read shifting pulse generation circuit configured to shift a write/read command, based on a write/read code and the system clock to generate the write/read shifting pulse.

3. The semiconductor device of claim 2, further comprising a mode register configured to extract and store the write/read code from an external control signal in a mode register write operation,
    wherein the write/read code has a logic bit set for setting a write/read shifting section in which the write/read command is shifted.

4. The semiconductor device of claim 1, wherein the pre-pulse generation circuit generates the pre-pulse from the write/read shifting pulse when the write/read operation is performed, and generates the pre-pulse from the write leveling activation signal when a write leveling operation is performed.

5. The semiconductor device of claim 4, wherein the pulse width of the pre-pulse generated in the write/read operation in a first clock mode is set to be greater than a pulse width of the pre-pulse generated in the write/read operation in a second clock mode, and
    wherein a frequency ratio of the system clock and the data clock is set to 1:L in the first clock mode, the frequency ratio of the system clock to the data clock is set to 1:M in the second clock mode, each of the 'M' and 'L' is set to a natural number greater than or equal to 2, and the 'M' is set to be greater than the 'L'.

6. The semiconductor device of claim 1, wherein the pre-pulse generation circuit comprises:
    a mode path signal generation circuit configured to generate a first mode path signal and a second mode path signal, based on the write leveling activation signal and a clock mode signal;
    a latch input signal generation circuit configured to generate a latch input signal and an inverted latch input signal, based on the write/read shifting pulse and the write leveling activation signal;
    a latch circuit configured to generate a pull-up signal, an inverted pull-up signal, a pull-down signal, and an inverted pull-down signal, based on the system clock, the latch input signal, and the inverted latch input signal;
    a drive signal generation circuit configured to generate a drive signal driven based on the pull-up signal and the inverted pull-down signal; and a pre-pulse output circuit configured to generate and output the pre-pulse, based on the first mode path signal, the second mode path signal, the drive signal, and the inverted pull-up signal.

7. The semiconductor device of claim 6, further comprising a mode register configured to extract and store the write leveling activation signal and the clock mode signal from an external control signal in a mode register write operation,
wherein the write leveling activation signal is activated for a write leveling operation, and
wherein the clock mode signal has a logic level according to a frequency ratio of the system clock and the data clock.

8. The semiconductor device of claim 6, wherein the mode path signal generation circuit generates the first mode path signal that is activated in a clock mode and generates the second mode path signal that is activated in a second clock mode, and
wherein the frequency ratio of the system clock and the data clock is set to 1:L in the first clock mode, the frequency ratio of the system clock and the data clock is set to 1:M in the second clock mode, each of the 'M' and 'L' is set to a natural number greater than or equal to 2, and the 'M' is set to be greater than the 'L'.

9. The semiconductor device of claim 8, wherein the pre-pulse output circuit generates the pre-pulse, based on the drive signal when the first mode path signal is activated, and generates the pre-pulse, based on the inverted pull-up signal when the second mode path signal is activated.

10. The semiconductor device of claim 1, wherein the write/read control signal comprises a first write/read control signal and a second write/read control signal, and
wherein the write/read control signal generation circuit generates the first write/read control signal from the pre-pulse when the pre-pulse is in a positive-phase state and generates the second write/read control signal from the pre-pulse when the pre-pulse is in a negative-phase state.

11. The semiconductor device of claim 1, wherein the write/read control signal generation circuit comprises:
a write/read latch input signal generation circuit configured to generate a write/read latch clock, a write/read latch input signal, and an inverted write/read latch input signal, based on a write/read phase signal, the pre-pulse, and the division clock;
a write/read latch circuit configured to generate a write/read pull-up signal and a write/read pull-down signal, based on the write/read latch clock, the write/read latch input signal, and the inverted write/read latch input signal; and
a write/read drive circuit configured to generate the write/read control signal, based on the write/read pull-up signal and the write/read pull-down signal.

12. The semiconductor device of claim 11, wherein the write/read latch input signal generation circuit receives the write/read phase signal that is set to have a first logic level when the pre-pulse is in a positive-phase state, and receives the write/read phase signal that is set to have a second logic level when the pre-pulse is in a negative-phase state.

13. The semiconductor device of claim 11, wherein the division clock comprises a first division clock and a first inverted division clock, and
wherein the write/read latch input signal generation circuit is configured to:
buffer the first inverted division clock to generate the write/read latch clock, inversely buffer the pre-pulse to generate the write/read latch input signal, and buffer the pre-pulse to generate the inverted write/read latch input signal when the write/read phase signal is in the first logic level, and
buffer the first division clock to generate the write/read latch clock, inversely buffer the pre-pulse to generate the write/read latch input signal, and buffer the pre-pulse to generate the inverted write/read latch input signal when the write/read phase signal is in the second logic level.

14. The semiconductor device of claim 11, wherein the write/read latch circuit generates the write/read pull-up signal, based on the write/read latch clock and the write/read latch input signal, and generates the write/read pull-down signal, based on the write/read latch clock and the inverted write/read latch input signal.

15. The semiconductor device of claim 11, wherein the write/read drive circuit pull-up drives the write/read control signal when the write/read pull-up signal is activated, and pull-down drives the write/read control signal when the write/read pull-down signal is activated.

16. The semiconductor device of claim 1, wherein the write leveling control circuit performs a write leveling operation in a state in which the frequency ratio of the system clock and the data clock is set to be constant.

17. The semiconductor device of claim 1, wherein the division clock comprises a first division clock, a first inverted division clock, a second division clock, and a second inverted division clock,
wherein a cycle of each of the first division clock, the first inverted division clock, the second division clock and the second inverted division clock is set to be 'K' times a cycle of the data clock,
wherein phases of the first division clock, the first inverted division clock, the second division clock and the second inverted division clock are set to be different from each other, and
wherein 'K' is set to a natural number equal to or greater than 2.

18. The semiconductor device of claim 17, wherein the division clock comprises a first division clock, a first inverted division clock, a second division clock, and a second inverted division clock, and
wherein the write leveling control circuit comprises:
a first leveling latch input signal generation circuit configured to generate a first leveling latch clock, a first leveling latch input signal, and a first inverted leveling latch input signal from the first inverted division clock, the second inverted division clock, and the pre-pulse, based on the write leveling activation signal;
a first leveling latch circuit that configured to generate a first leveling pull-up signal and a first leveling pull-down signal, based on the first leveling latch clock, the first leveling latch input signal, and the first inverted leveling latch input signal;
a first leveling drive circuit configured to drive a signal of a node, based on the first leveling pull-up signal and the first leveling pull-down signal; and
a detection data latch configured to inversely buffer the signal of the node to generate detection data, and latche the signal of the node and the detection data.

19. The semiconductor device of claim 18, wherein the write leveling control circuit further comprises:
a second leveling latch input signal generation circuit configured to generate a second leveling latch clock, a second leveling latch input signal, and a second inverted leveling latch input signal from the first division clock, the second division clock, and the pre-pulse, based on the write leveling activation signal;

a second leveling latch circuit configured to generate a second leveling pull-up signal and a second leveling pull-down signal, based on the second leveling latch clock, the second leveling latch input signal, and the second inverted leveling latch input signal; and a second leveling drive circuit configured to drive a signal of a node, based on the second leveling pull-up signal and the second leveling pull-down signal.

20. A semiconductor system comprising:

a controller configured to output an external control signal, a system clock, a data clock, and data and receive data and detection data; and a semiconductor device configured to receive the external control signal, the system clock, the data clock, and the data and apply the detection data to the controller, wherein the semiconductor device generates a pre-pulse, based on a write shifting pulse, a read shifting pulse, and a write leveling activation signal, generates a write control signal for controlling input of the data, based on the pre-pulse, generates a read control signal for controlling output of the data, based on the pre-pulse, and generates the detection data including information on a phase difference between the data clock and the system clock, based on the pre-pulse.

21. A semiconductor system comprising:

a controller configured to output a system clock and a data clock and receive detection data; and a semiconductor device configured to generate a pre-pulse, based on a write leveling activation signal and the system clock when entering a write leveling operation and generate detection data, based on the pre-pulse and a division clock to apply the detection data to the controller, wherein the detection data is set to a first logic level when a phase of the data clock is faster than a phase of the system clock, and wherein the detection data is set to a second logic level when the phase of the data clock is slower than the phase of the system clock, wherein the semiconductor device performs the write leveling operation in a state in which a frequency ratio of the system clock and the data clock is set to be constant.

22. The semiconductor system of claim 21, wherein the semiconductor device divides the data clock to generate the division clock.

23. The semiconductor system of claim 21, wherein the controller applies the data clock set to a preset logic level during a first waiting section before entering the write leveling operation and a second waiting section after entering the write leveling operation to the semiconductor device.

24. The semiconductor system of claim 23, wherein the controller applies the data clock comprising at least one cycle during a write leveling section from a time point when the second waiting section ends to the semiconductor device.

25. The semiconductor system of claim 24, wherein the controller changes the phase of the data clock according to the logic level of the detection data applied from the semiconductor device at the time when the write leveling section ends.

26. The semiconductor system of claim 21, wherein the controller controls the semiconductor device to exit the write leveling operation when the logic level of the detection data transitions.

* * * * *